(12) United States Patent
Miyazaki et al.

(10) Patent No.: US 9,466,675 B2
(45) Date of Patent: Oct. 11, 2016

(54) METHOD OF MANUFACTURING SILICON CARBIDE SEMICONDUCTOR DEVICE

(71) Applicant: Sumitomo Electric Industries, Ltd., Osaka-shi (JP)

(72) Inventors: Tomihito Miyazaki, Osaka (JP); Chikayuki Okamoto, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/779,924

(22) PCT Filed: Mar. 4, 2014

(86) PCT No.: PCT/JP2014/055390
§ 371 (c)(1),
(2) Date: Sep. 24, 2015

(87) PCT Pub. No.: WO2014/174904
PCT Pub. Date: Oct. 30, 2014

(65) Prior Publication Data
US 2016/0056241 A1  Feb. 25, 2016

(30) Foreign Application Priority Data

Apr. 25, 2013 (JP) .................... 2013-092491

(51) Int. Cl.
*H01L 21/336* (2006.01)
*H01L 29/16* (2006.01)
(Continued)

(52) U.S. Cl.
CPC ....... *H01L 29/1608* (2013.01); *H01L 21/0217* (2013.01); *H01L 21/02126* (2013.01);
(Continued)

(58) Field of Classification Search
CPC ............. H01L 29/045; H01L 29/0634; H01L 29/66734; H01L 29/7811; H01L 29/7813; H01L 21/02639; H01L 21/02532; H01L 21/0262; H01L 21/0243; H01L 21/0245; H01L 21/02381; H01L 29/66068; H01L 21/31116; H01L 21/0465; H01L 29/7802; H01L 29/1608

See application file for complete search history.

(56) References Cited

U.S. PATENT DOCUMENTS 6,319,638 B1   11/2001 Inomoto
2005/0233539 A1 * 10/2005 Takeuchi ............. H01L 29/045
                                                            438/400

(Continued)

FOREIGN PATENT DOCUMENTS

JP  2000-286179 A   10/2000
JP  2007-096139 A    4/2007
JP  2013-021040 A    1/2013

OTHER PUBLICATIONS

International Search Report in PCT International Application No. PCT/JP2014/055390, dated Jun. 3, 2014.

*Primary Examiner* — Charles Garber
*Assistant Examiner* — Abdulfattah Mustapha
(74) *Attorney, Agent, or Firm* — Venable LLP; Michael A. Sartori; F. Brock Riggs

(57) ABSTRACT

A recess is formed by partially etching a silicon carbide substrate. A mask layer is formed on the silicon carbide substrate by means of photolithography using the recess as an alignment mark. An impurity is implanted into the silicon carbide substrate using the mask layer. The silicon carbide substrate is annealed. After the annealing, a first electrode layer is deposited on the silicon carbide substrate. The first electrode layer is patterned by means of photolithography using the recess in the silicon carbide substrate as an alignment mark.

9 Claims, 39 Drawing Sheets

(51) Int. Cl.

| | | |
|---|---|---|
| *H01L 23/544* | (2006.01) | |
| *H01L 21/04* | (2006.01) | |
| *H01L 29/66* | (2006.01) | |
| *H01L 29/78* | (2006.01) | |
| *H01L 29/06* | (2006.01) | |
| *H01L 21/02* | (2006.01) | |
| *H01L 21/311* | (2006.01) | |
| *H01L 21/3115* | (2006.01) | |

(52) U.S. Cl.
CPC ... *H01L21/02164* (2013.01); *H01L 21/02694* (2013.01); *H01L 21/049* (2013.01); *H01L 21/0465* (2013.01); *H01L 21/311* (2013.01); *H01L 21/3115* (2013.01); *H01L 23/544* (2013.01); *H01L 29/0619* (2013.01); *H01L 29/66068* (2013.01); *H01L 29/78* (2013.01); *H01L 29/7827* (2013.01); *H01L 2223/54426* (2013.01); *H01L 2223/54453* (2013.01); *H01L 2924/0002* (2013.01)

(56) References Cited

U.S. PATENT DOCUMENTS

| | | |
|---|---|---|
| 2007/0072398 A1 | 3/2007 | Shibata et al. |
| 2008/0220620 A1* | 9/2008 | Kawada .............. H01L 21/0475 438/795 |
| 2014/0187048 A1* | 7/2014 | Murakami .......... H01L 21/3065 438/703 |

* cited by examiner

METHOD OF MANUFACTURING SILICON CARBIDE SEMICONDUCTOR DEVICE

TECHNICAL FIELD

The present invention relates to methods of manufacturing silicon carbide semiconductor devices, and more particularly to a method of manufacturing a silicon carbide semiconductor device using an alignment mark.

BACKGROUND ART

In a method of manufacturing a semiconductor device such as a MOSFET (Metal Oxide Semiconductor Field Effect Transistor), usually a plurality of photolithography steps are performed. An alignment mark is used as a positional reference for aligning patterns with each other that are formed by the photolithography steps. Japanese Patent Laying-Open No. 2000-286179 discloses that an alignment mark may be etched in an $SiO_2$ film on a semiconductor substrate.

CITATION LIST

Patent Document

PTD 1: Japanese Patent Laying-Open No. 2000-286179

SUMMARY OF INVENTION

Technical Problem

In the technique described in the above publication, if the semiconductor substrate is a silicon carbide substrate, annealing for activating impurities implanted into the substrate will be performed at a high temperature of about 1500° C. or more. The alignment mark made of the $SiO_2$ film cannot withstand such a high temperature. In this case, the same alignment mark cannot be used before and after the activation annealing.

The present invention has been made to solve the above problem, and an object of the present invention is to provide a method of manufacturing a silicon carbide semiconductor device in which the same alignment mark can be used before and after activation annealing.

Solution to Problem

A method of manufacturing a silicon carbide semiconductor device of the present invention includes the following steps. A recess is formed in a silicon carbide substrate by partially etching the silicon carbide substrate. A mask layer having a pattern is formed on the silicon carbide substrate by means of photolithography using the recess in the silicon carbide substrate as an alignment mark. An impurity is implanted into the silicon carbide substrate using the mask layer. The silicon carbide substrate is annealed in order to activate the impurity. After the silicon carbide substrate is annealed, a first electrode layer is deposited on the silicon carbide substrate. The first electrode layer is patterned by means of photolithography using the recess in the silicon carbide substrate as an alignment mark.

Advantageous Effects of Invention

According to the present invention, the recess as an alignment mark is formed of the silicon carbide substrate. The recess thus has sufficient heat resistance at a temperature of the activation annealing as well. Accordingly, a method of manufacturing a silicon carbide semiconductor device in which the same alignment mark can be used before and after activation annealing can be provided.

DESCRIPTION OF EMBODIMENTS

Figure 1:
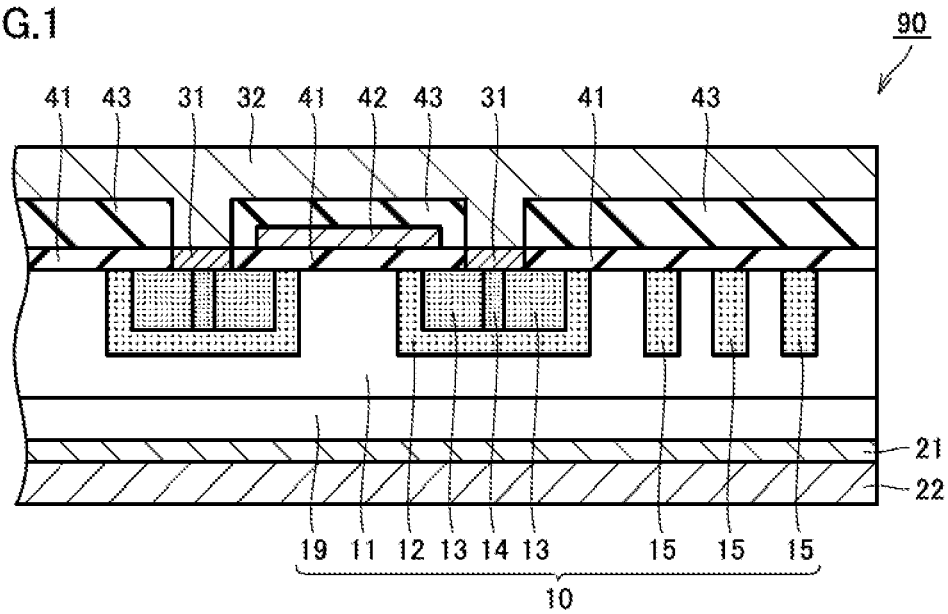
FIG. 1 is a partial sectional view schematically showing the structure of a silicon carbide semiconductor device according to a first embodiment of the present invention.

Embodiments of the present invention will be described below with reference to the drawings. In the following drawings, the same or corresponding parts are designated by the same reference numbers and description thereof will not be repeated.

First, a summary of the embodiments will be described in (i) to (ix) below.

(i) A method of manufacturing a silicon carbide semiconductor device 90 in this embodiment includes the following steps. A recess A1 is formed in an epitaxial substrate 10 by partially etching epitaxial substrate 10. A mask layer 72 having a pattern is formed on epitaxial substrate 10 by means of photolithography using recess A1 in epitaxial substrate 10 as an alignment mark. An impurity is implanted into epitaxial substrate 10 using mask layer 72. Epitaxial substrate 10 is annealed in order to activate the impurity. After epitaxial substrate 10 is annealed, a first electrode layer 42 is deposited on epitaxial substrate 10. First electrode layer 42 is patterned by means of photolithography using recess A1 in epitaxial substrate 10 as an alignment mark.

According to this manufacturing method, recess A1 is formed of epitaxial substrate 10. Recess A1 thus has sufficient heat resistance at a temperature of the activation annealing as well. Accordingly, recess A1 can be used as an alignment mark both before and after the activation annealing.

(ii) In (i) above, epitaxial substrate 10 may be annealed at 1500° C. or more and 2000° C. or less.

The impurity is sufficiently activated owing to the annealing temperature of 1500° C. or more. The annealing can be more readily performed owing to the annealing temperature of 2000° C. or less.

(iii) In (i) or (ii) above, before mask layer 72 is formed, a protecting film 61b made of a material different from each of a material for mask layer 72 and silicon carbide may be formed on recess A1.

Protecting film 61b can prevent direct contamination of epitaxial substrate 10.

(iv) In (iii) above, after the impurity is implanted, protecting film 61b may be removed.

In this case, epitaxial substrate 10 is protected by protecting film 61b during the impurity implantation. Thus, the contamination of epitaxial substrate 10 during the impurity implantation can be prevented.

(v) In (iv) above, protecting film 61b may be removed before epitaxial substrate 10 is annealed.

Thus, contaminants are removed along with protecting film 61b before the annealing. Accordingly, the diffusion of the contaminants into epitaxial substrate 10 during the annealing can be prevented.

(vi) In (v) above, the material for protecting film 61b may have a melting point of 1500° C. or less.

Thus, protecting film 61b having difficulty in withstanding the temperature of the impurity activation annealing is removed before the annealing. Accordingly, the low heat resistance of protecting film 61b does not present any problems.

(vii) In (v) or (vi) above, the material for protecting film 61b may contain at least one of silicon oxide, silicon nitride and silicon oxynitride.

Protecting film 61b having difficulty in withstanding the temperature of the impurity activation annealing is thus removed before the annealing. Accordingly, the low heat resistance of protecting film 61b does not present any problems.

(viii) In (i) to (vii) above, after first electrode layer 42 is patterned, a second electrode layer 31 may be formed on epitaxial substrate 10 by means of photolithography using recess A1 in epitaxial substrate 10 as an alignment mark.

Thus, a pattern of second electrode layer 31 can be aligned with the pattern for impurity implantation with high accuracy.

(ix) In (i) to (vii) above, during the patterning of first electrode layer 42, a mark portion A2 may be formed by partially removing first electrode layer 42. A second electrode layer 31 may be formed on epitaxial substrate 10 by means of photolithography using mark portion A2 of first electrode layer 42 as an alignment mark.

Thus, a pattern of second electrode layer 31 can be aligned with the pattern of first electrode layer 42 with high accuracy.

Next, first and second embodiments will be described below as a further detailed description of the embodiments of the present application invention.

First Embodiment

Referring to FIG. 1, a MOSFET 90 (silicon carbide semiconductor device) includes an epitaxial substrate 10 (silicon carbide substrate), a gate oxide film 41 (gate insulating film), a gate electrode 42 (first electrode layer), an interlayer insulating film 43, a source electrode 31 (second electrode layer), a source interconnect layer 32, a drain electrode 21, and a drain interconnect layer 22.

Epitaxial substrate 10 is made of silicon carbide. Epitaxial substrate 10 includes a single-crystal substrate 19, a drift layer 11, body regions 12, source regions 13, contact regions 14, and guard rings 15.

Single-crystal substrate 19 has n type conductivity (first conductivity type). Drift layer 11 is provided on single-crystal substrate 19. Drift layer 11 has n type conductivity and an impurity concentration lower than an impurity concentration in single-crystal substrate 19. Body regions 12 are provided on drift layer 11 and have p type conductivity (second conductivity type). Each of source regions 13 is provided on body region 12, and separated from drift layer 11 by body region 12. Source regions 13 have n type conductivity. Each of contact regions 14 extends from a surface of epitaxial substrate 10 into epitaxial substrate 10 and is connected to body region 12. Contact regions 14 have p type conductivity and an impurity concentration higher than an impurity concentration in body regions 12. Guard rings 15 have p type conductivity.

Gate oxide film 41 covers, as a gate insulating film, body regions 12 between source regions 13 and drift layer 11 on epitaxial substrate 10. Gate electrode 42 is provided on gate oxide film 41. Interlayer insulating film 43 covers gate electrode 42, and insulates gate electrode 42 and source interconnect layer 32 from each other.

Source electrode 31 is, as an ohmic electrode, in contact with each of source regions 13 and contact regions 14, and is distant from each of body regions 12 and drift layer 11. As least a portion of source electrode 31 which is in contact with epitaxial substrate 10 is preferably made of silicide. Source interconnect layer 32 covers source electrode 31 and interlayer insulating film 43. Source interconnect layer 32 is preferably made of aluminum or an aluminum alloy. Drain electrode 21 is an ohmic electrode provided on drift layer 11 with single-crystal substrate 19 interposed therebetween. Drain interconnect layer 22 covers drain electrode 21.

Next, a method of manufacturing MOSFET 90 will be described.

Figure 2:
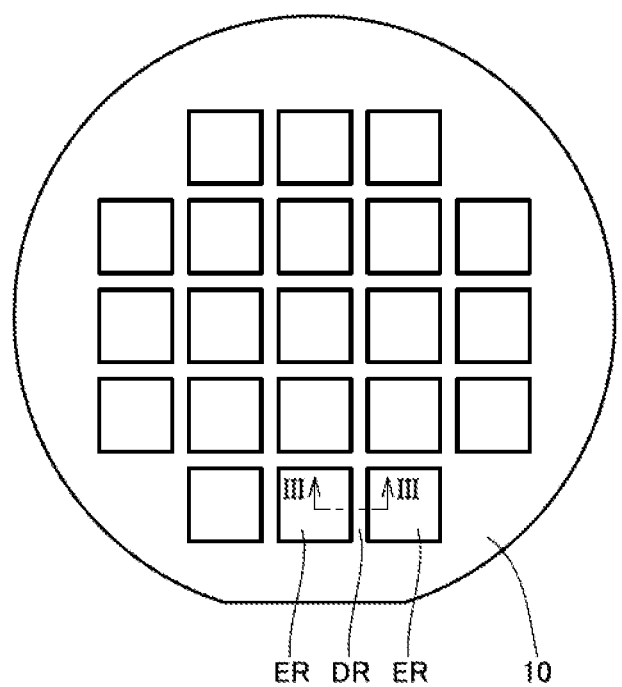
FIG. 2 is a plan view schematically showing chip regions and a dicing region of a silicon carbide substrate in a method of manufacturing the silicon carbide semiconductor device according to the first embodiment of the present invention.

Referring to FIG. 2, epitaxial substrate 10 is prepared. Epitaxial substrate 10 is partitioned into chip regions ER and a dicing region DR for use. Each of chip regions ER is a portion which will eventually be an individual MOSFET 90. Dicing region DR is a portion where dicing is performed for separating chip regions ER from one another.

Figure 3:
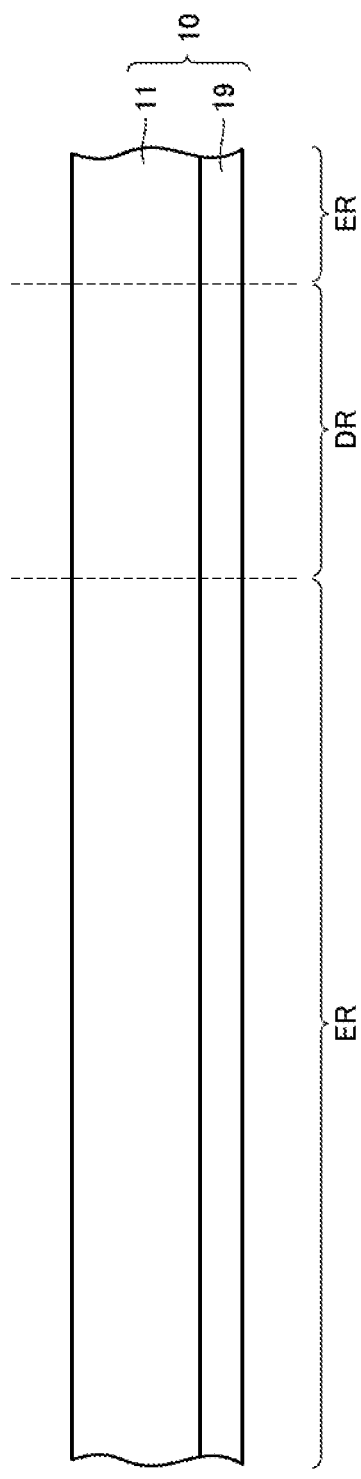
FIG. 3 is a partial sectional view schematically showing a first step of the method of manufacturing the silicon carbide semiconductor device according to the first embodiment of the present invention.

Referring to FIG. 3, epitaxial substrate 10 is obtained by forming drift layer 11 on single-crystal substrate 19 by epitaxial growth. The epitaxial growth may be performed by CVD (Chemical Vapor Deposition).

Figure 4:
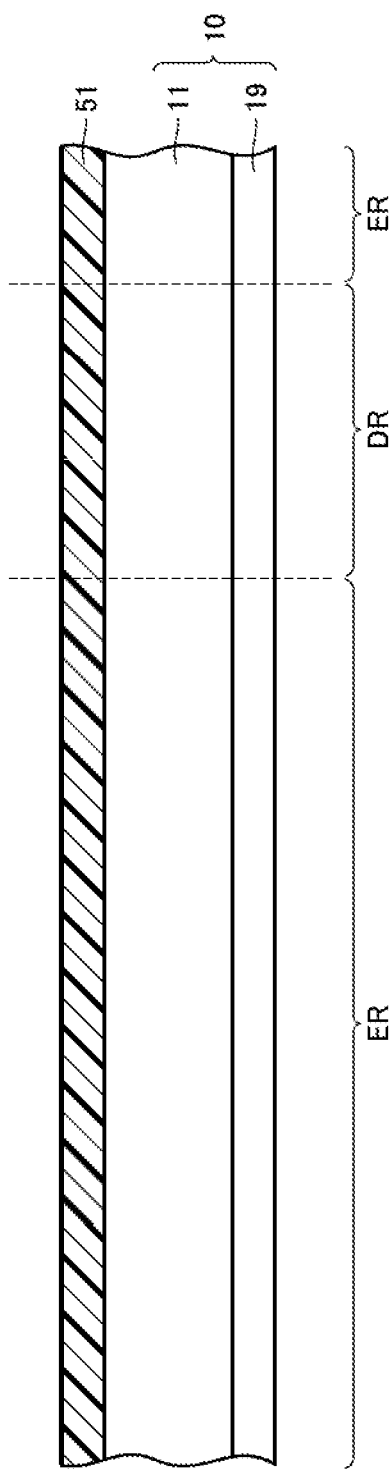
FIG. 4 is a partial sectional view schematically showing a second step of the method of manufacturing the silicon carbide semiconductor device according to the first embodiment of the present invention.

Referring to FIG. 4, a photoresist layer 51 is formed on drift layer 11. Photoresist layer 51 is formed by applying a photoresist solution by means ofa coater.

Figure 5:
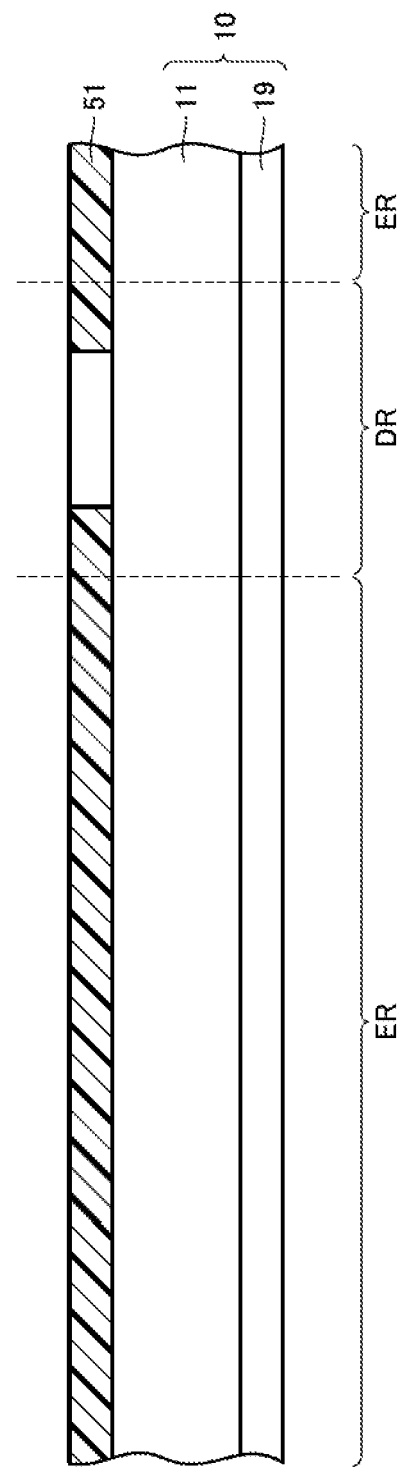
FIG. 5 is a partial sectional view schematically showing a third step of the method of manufacturing the silicon carbide semiconductor device according to the first embodiment of the present invention.

Referring to FIG. 5, a pattern is formed in photoresist layer 51. The pattern is formed by exposure with an exposure device and development with a development device of photoresist layer 51.

Figure 6:
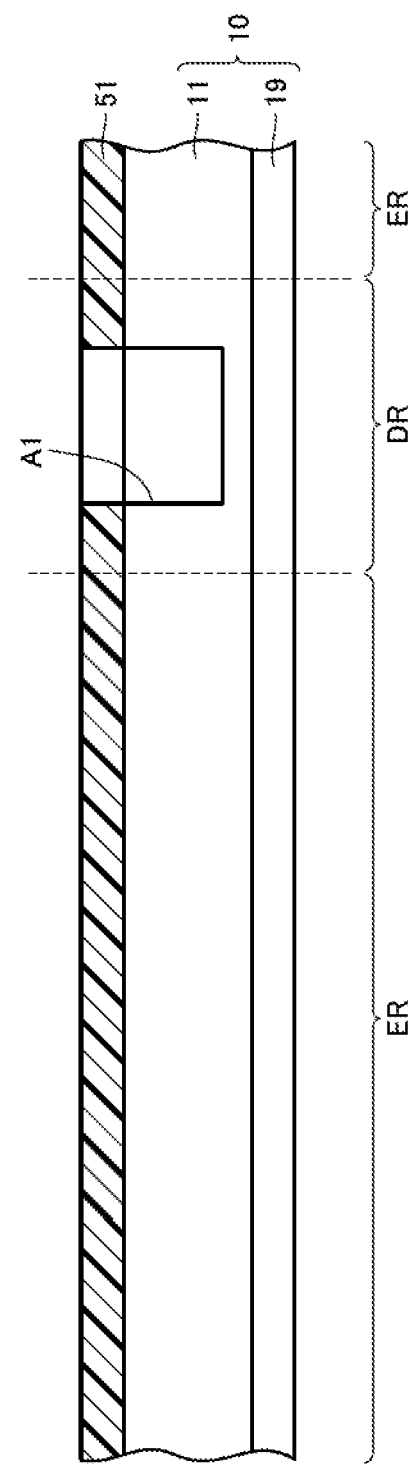
FIG. 6 is a partial sectional view schematically showing a fourth step of the method of manufacturing the silicon carbide semiconductor device according to the first embodiment of the present invention.
Figure 7:
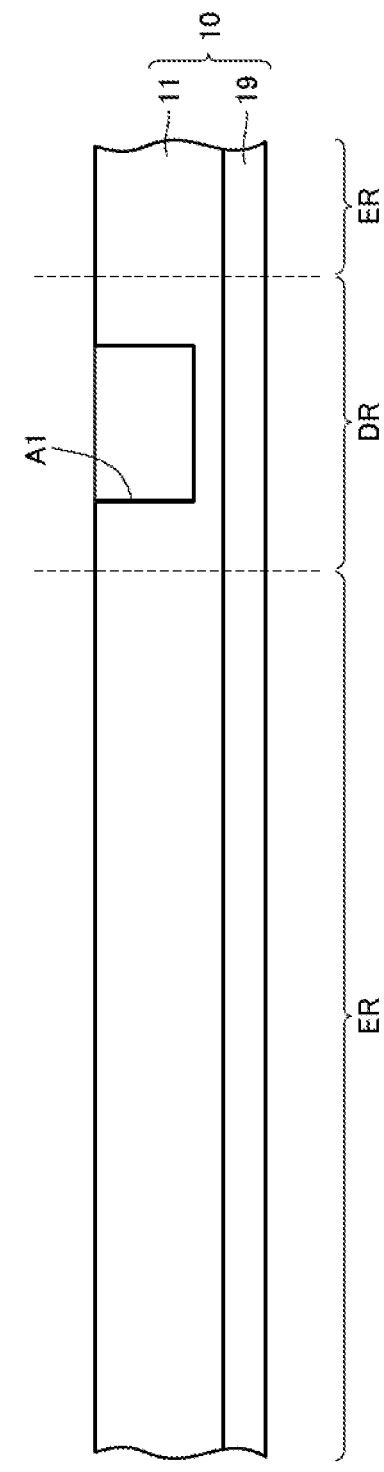
FIG. 7 is a partial sectional view schematically showing a fifth step of the method of manufacturing the silicon carbide semiconductor device according to the first embodiment of the present invention.

Referring to FIG. 6, epitaxial substrate 10 is partially etched with photoresist layer 51 as a mask. Specifically, drift layer 11 is partially etched on the surface of epitaxial substrate 10. A recess A1 is thus formed in epitaxial substrate 10. The depth of recess A1 is preferably greater than 0.1 μm, and is, for example, about 0.5 μm. Photoresist layer 51 is then removed (FIG. 7).

Figure 8:
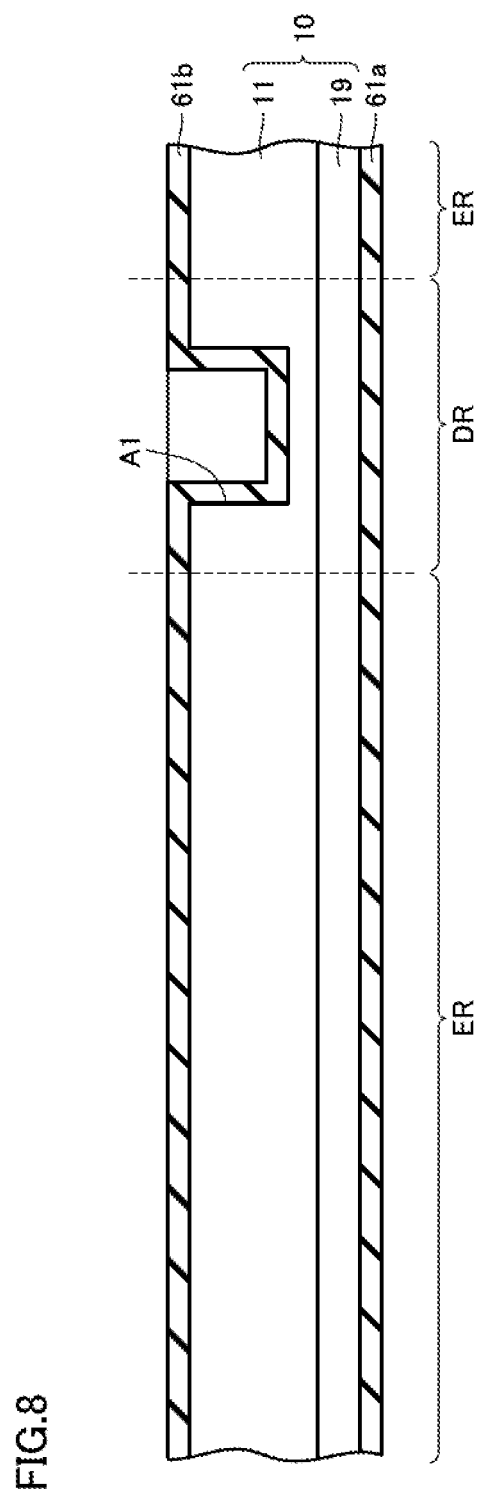
FIG. 8 is a partial sectional view schematically showing a sixth step of the method of manufacturing the silicon carbide semiconductor device according to the first embodiment of the present invention.

Referring to FIG. 8, a protecting film 61b is formed on the surface of epitaxial substrate 10 where recess A1 has been formed. Protecting film 61b is thus formed on recess A1. A protecting film 61*a* may additionally be formed on a surface opposite to this surface. Protecting films 61*a* and 61*b* are made of a material different from each of a material for a mask layer 72 and silicon carbide, and are preferably made of a non-metal material. The material for protecting film 61*b* may have a melting point of 1500° C. or less. The material for protecting films 61*a* and 61*b* may contain at least one of silicon oxide ($SiO_2$), silicon nitride (SiN) and silicon oxynitride (SiON), and may be a silicon oxide film, a silicon nitride film or a silicon oxynitride film. Protecting films 61*a* and 61*b* are formed, for example, by thermal oxidation of epitaxial substrate 10. The thickness of protecting film 61*b* is preferably smaller than the depth of recess A1, preferably greater than about 5 nm and smaller than about 0.2 μm, and is, for example, about 0.1 μm.

Figure 9:
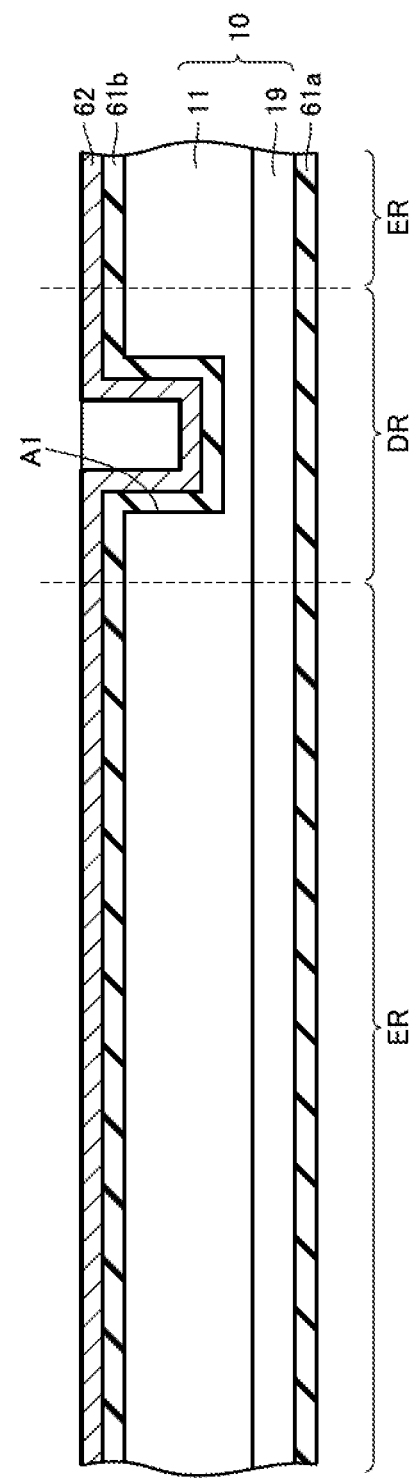
FIG. 9 is a partial sectional view schematically showing a seventh step of the method of manufacturing the silicon carbide semiconductor device according to the first embodiment of the present invention.
Figure 10:
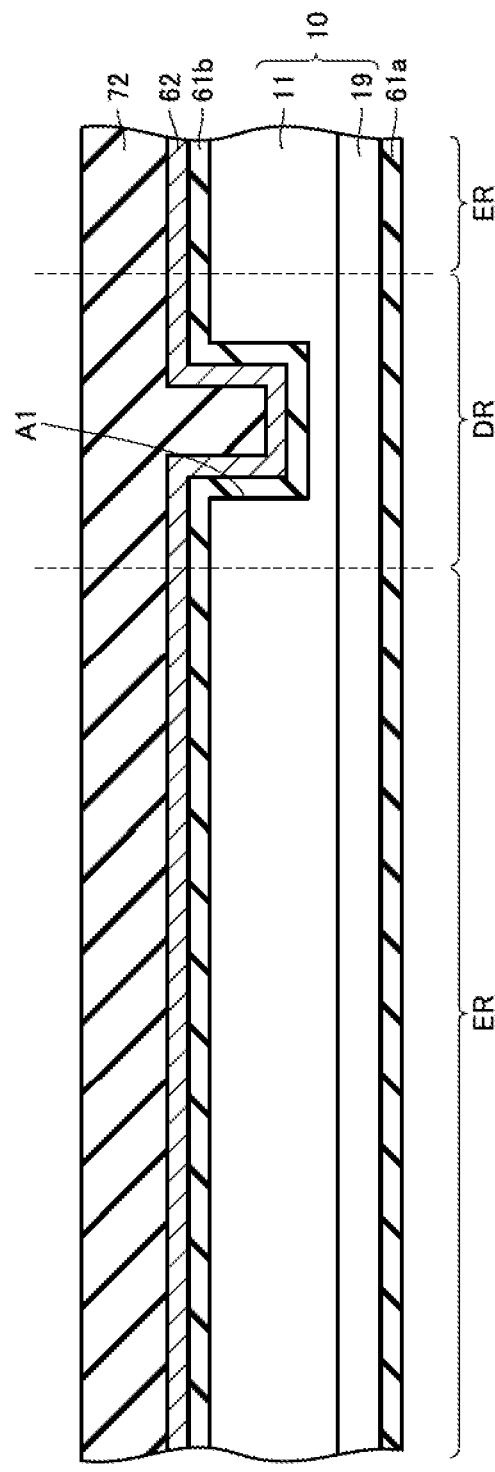
FIG. 10 is a partial sectional view schematically showing an eighth step of the method of manufacturing the silicon carbide semiconductor device according to the first embodiment of the present invention.
Figure 11:
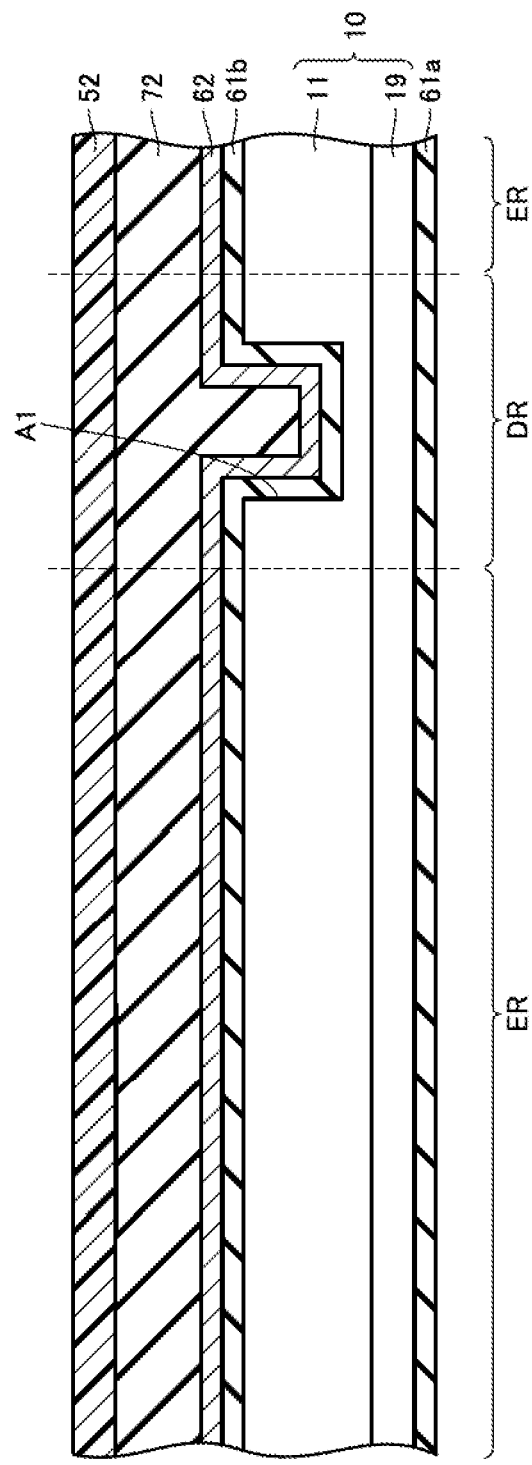
FIG. 11 is a partial sectional view schematically showing a ninth step of the method of manufacturing the silicon carbide semiconductor device according to the first embodiment of the present invention.

Referring to FIG. 9, an etching stop film 62 is formed on protecting film 61*b*. The thickness of etching stop film 62 is preferably smaller than the depth of recess A1. Etching stop film 62 is made of a material different from each of the material for protecting film 61*b* and the material for mask layer 72 to be described later, and is made of, for example, polysilicon. The thickness of etching stop film 62 is preferably smaller than the depth of recess A1, preferably greater than about 0.1 μm and smaller than about 1 μm, and is, for example, about 0.3 μm.

Referring to FIGS. 10 to 14, mask layer 72 having a pattern is formed on epitaxial substrate 10 by means of photolithography using recess A1 in epitaxial substrate 10 as an alignment mark, as described below.

Figure 12:
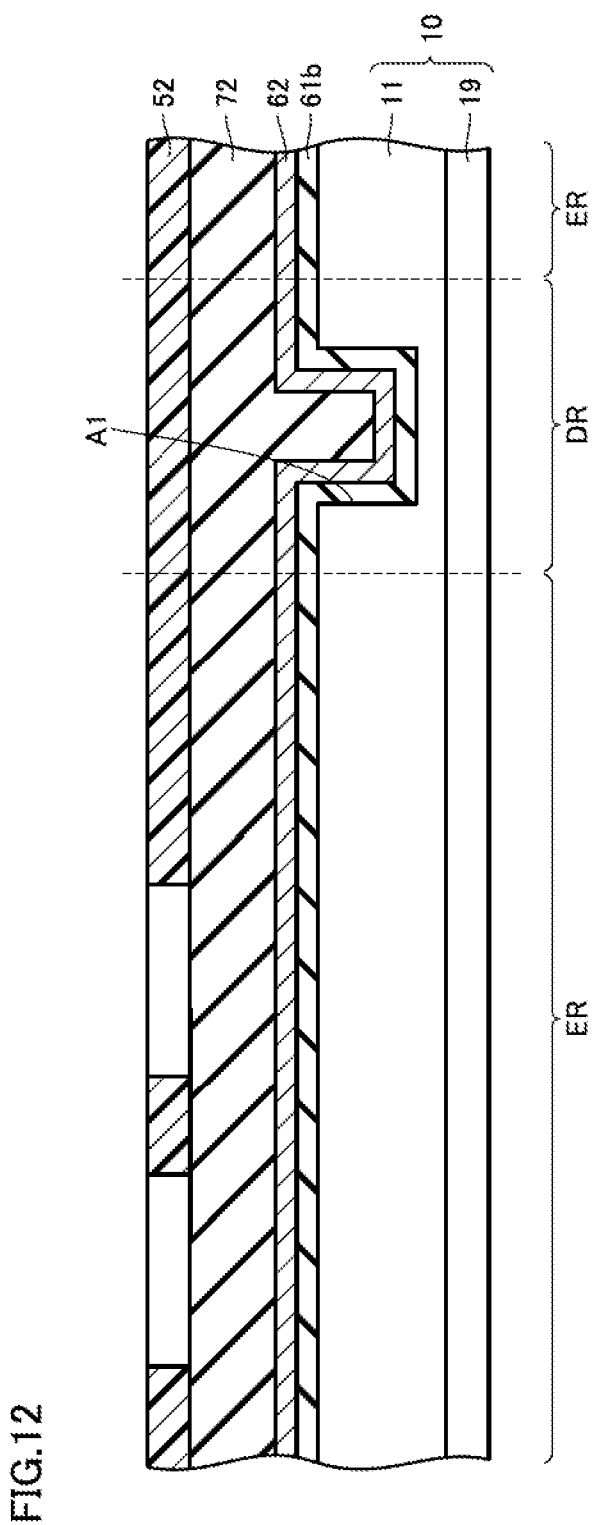
FIG. 12 is a partial sectional view schematically showing a tenth step of the method of manufacturing the silicon carbide semiconductor device according to the first embodiment of the present invention.
Figure 13:
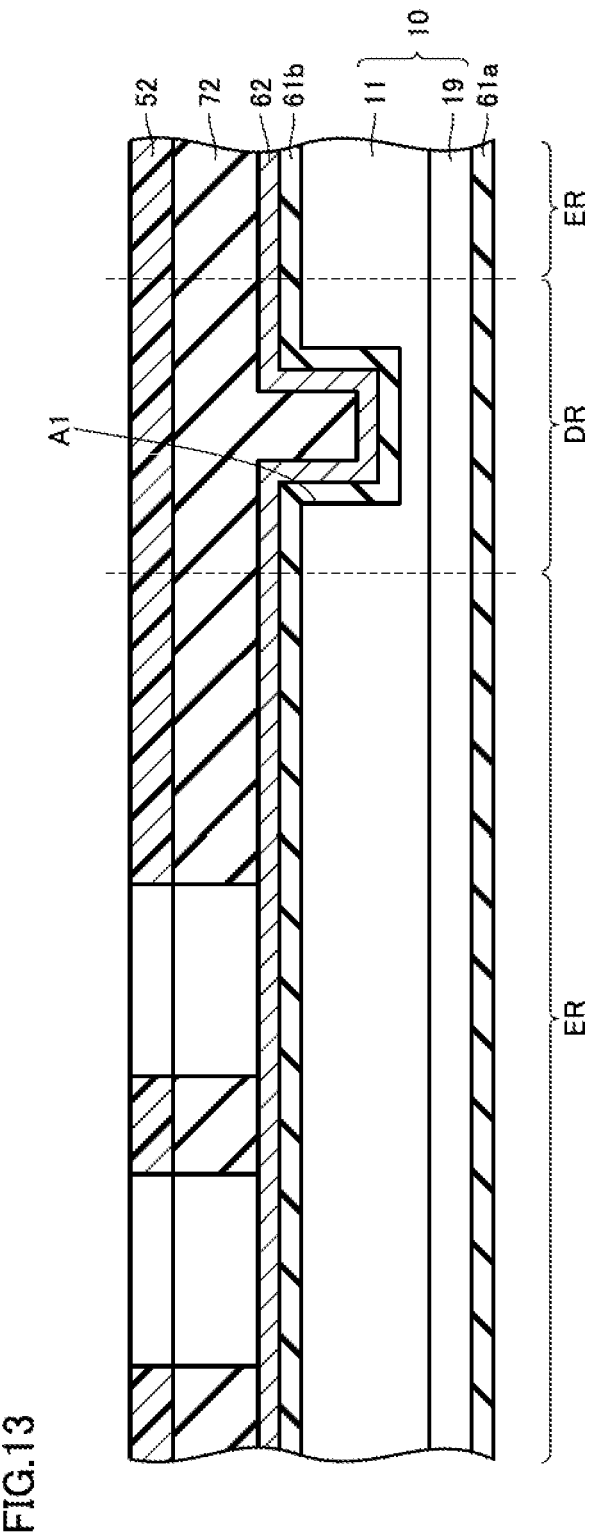
FIG. 13 is a partial sectional view schematically showing an eleventh step of the method of manufacturing the silicon carbide semiconductor device according to the first embodiment of the present invention.
Figure 14:
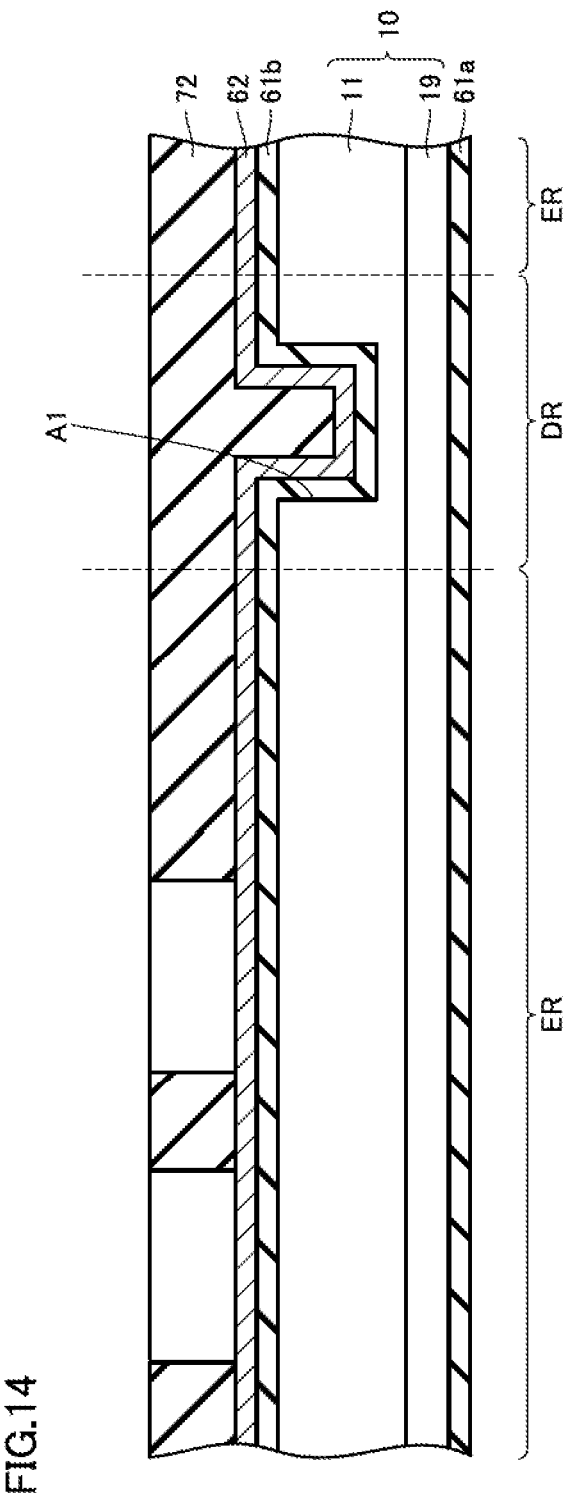
FIG. 14 is a partial sectional view schematically showing a twelfth step of the method of manufacturing the silicon carbide semiconductor device according to the first embodiment of the present invention.

First, mask layer 72 (FIG. 10) is deposited. The thickness of mask layer 72 may be greater than the depth of recess A1. Mask layer 72 is made of a material suitable for an ion implantation mask, and is made of, for example, silicon oxide ($SiO_2$). A photoresist layer 52 (FIG. 11) is formed on mask layer 72. Photoresist layer 52 is formed by applying a photoresist solution by means of a coater. A pattern is formed in photoresist layer 52 (FIG. 12). The pattern is formed by exposure with an exposure device and development with a development device of photoresist layer 52. The exposure device optically recognizes the position of recess A1 as an alignment mark in order to perform alignment for the exposure. This recognition may be achieved by reflection of light from a surface of etching stop film 62 on recess A1. Then, mask layer 72 is partially etched with photoresist layer 52 as a mask. The pattern of photoresist layer 52 is thus transferred to mask layer 72 (FIG. 13). Photoresist layer 52 may then be removed (FIG. 14).

Figure 15:
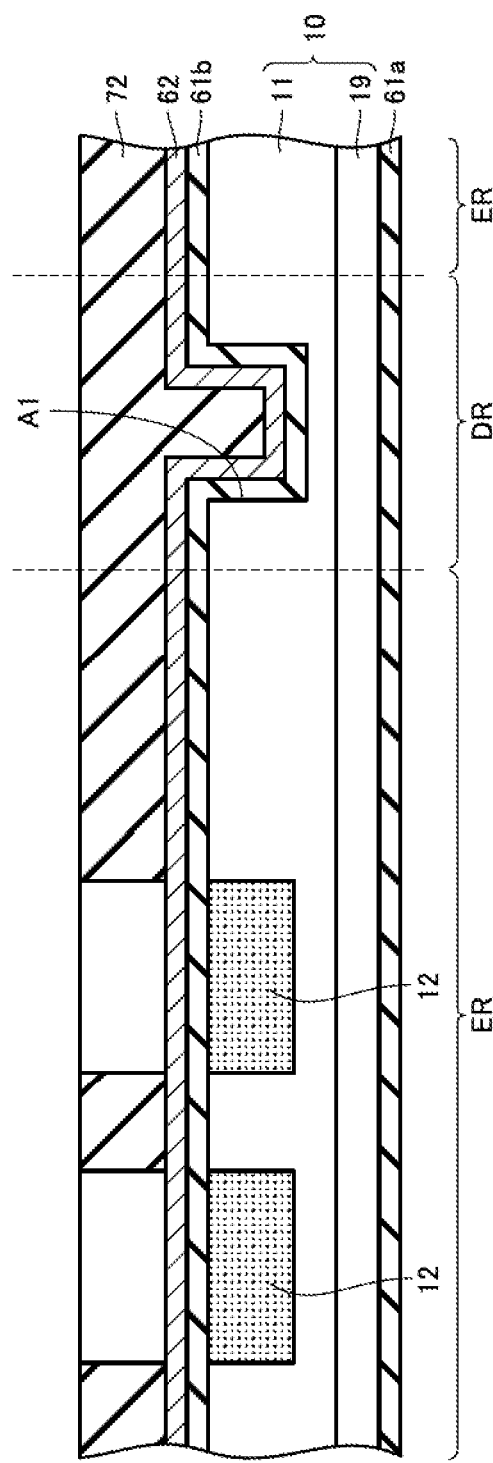
FIG. 15 is a partial sectional view schematically showing a thirteenth step of the method of manufacturing the silicon carbide semiconductor device according to the first embodi

Referring to FIG. 15, an impurity is implanted into epitaxial substrate 10 with mask layer 72 as a mask. Body regions 12 are thus formed.

Figure 16:
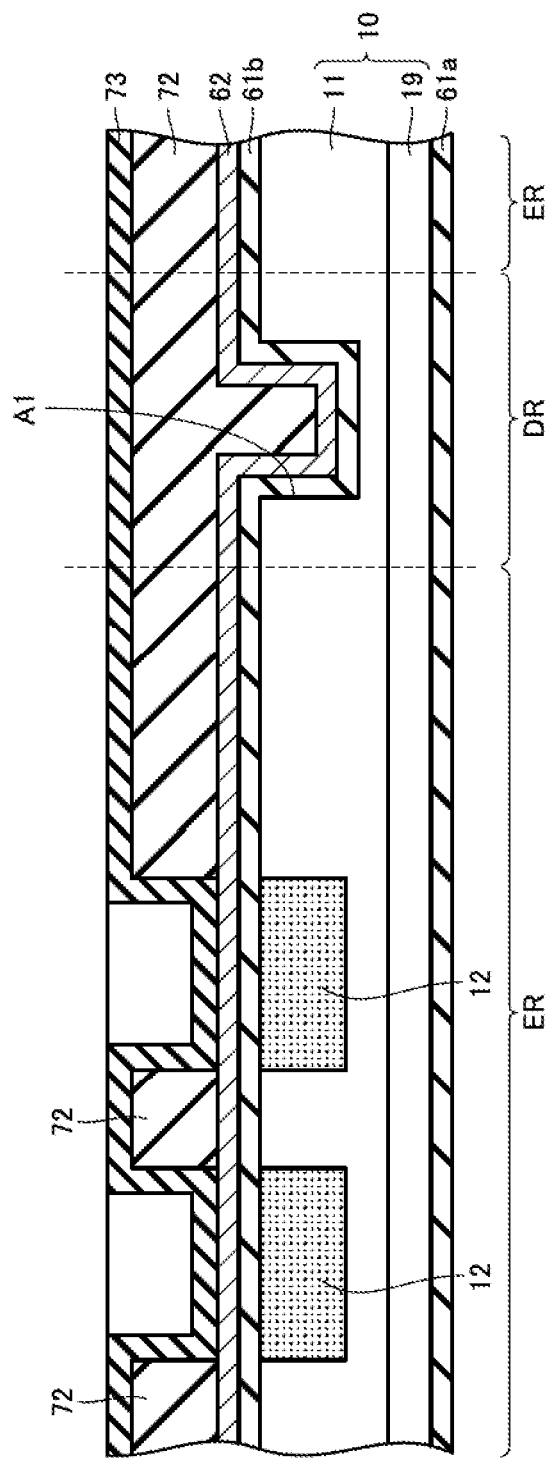
- FIG. 16 is a partial sectional view schematically showing a fourteenth step of the method of manufacturing the silicon carbide semiconductor device according to the first embodiment of the present invention.

Referring to FIG. 16, a sidewall film 73 is formed on epitaxial substrate 10 provided with mask layer 72. Sidewall film 73 is formed so as to adhere to sidewalls of mask layer 72. Sidewall film 73 may be made of the same material as that for mask layer 72.

Figure 17:
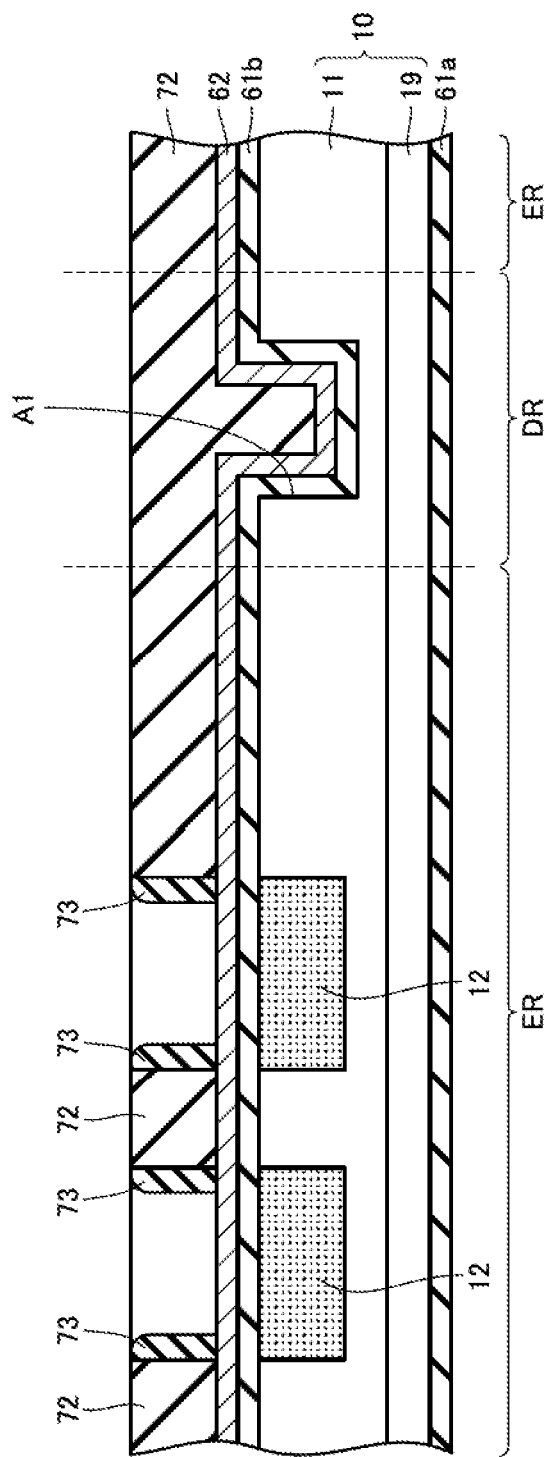
FIG. 17 is a partial sectional view schematically showing a fifteenth step of the method of manufacturing the silicon carbide semiconductor device according to the first embodiment of the present invention.

Referring to FIG. 17, sidewall film 73 is etched except for portions on the sidewalls of mask layer 72. Such etching can be performed by means of RIE (Reactive Ion Etching) or ion milling.

Figure 18:
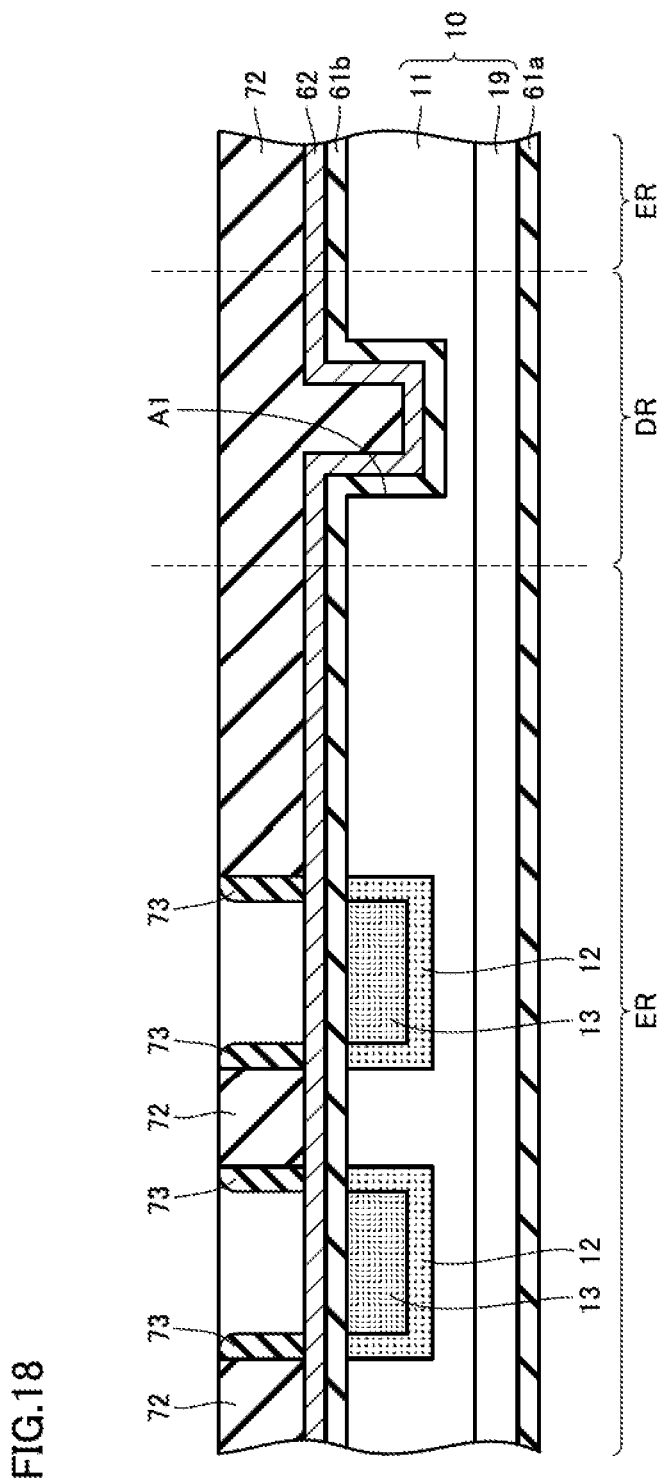
FIG. 18 is a partial sectional view schematically showing a sixteenth step of the method of manufacturing the silicon carbide semiconductor device according to the first embodiment of the present invention.
Figure 19:
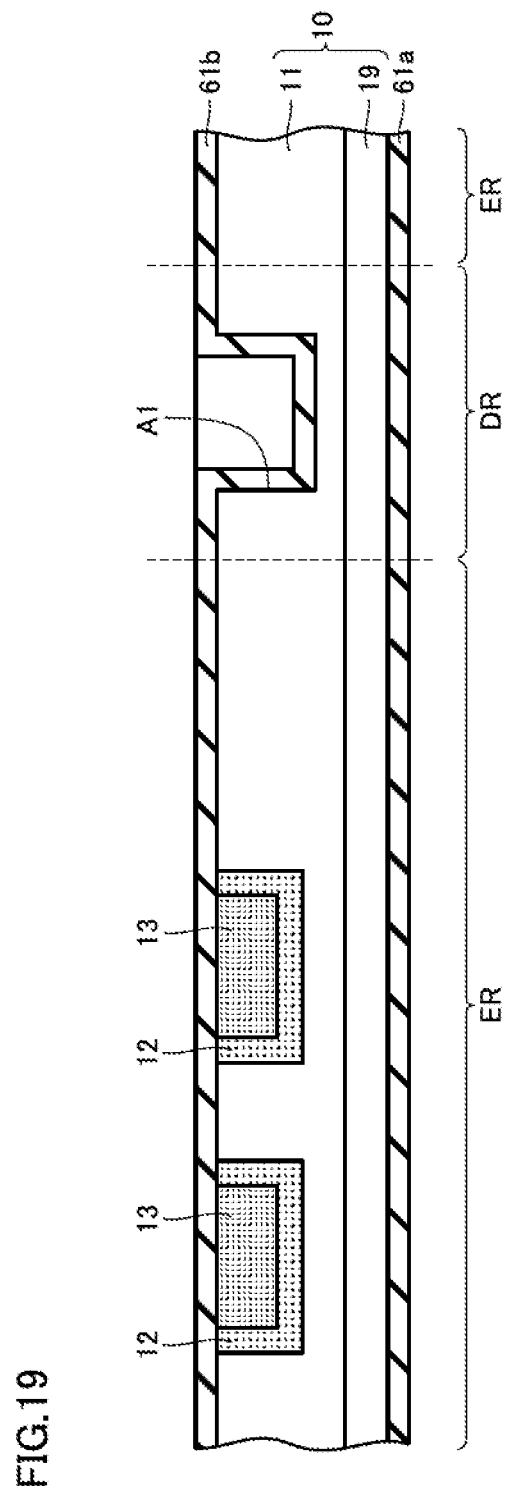
FIG. 19 is a partial sectional view schematically showing a seventeenth step of the method of manufacturing the silicon carbide semiconductor device according to the first embodiment of the present invention.

Referring to FIG. 18, an impurity is implanted into epitaxial substrate 10 with mask layer 72 and sidewall film 73 as a mask. Source regions 13 are thus formed. Then, mask layer 72, sidewall film 73 and etching stop film 62 are removed (FIG. 19). Mask layer 72 and sidewall film 73 can be removed, for example, by wet etching with hydrofluoric acid. Etching stop film 62 can be removed, for example, by dry etching.

Figure 20:
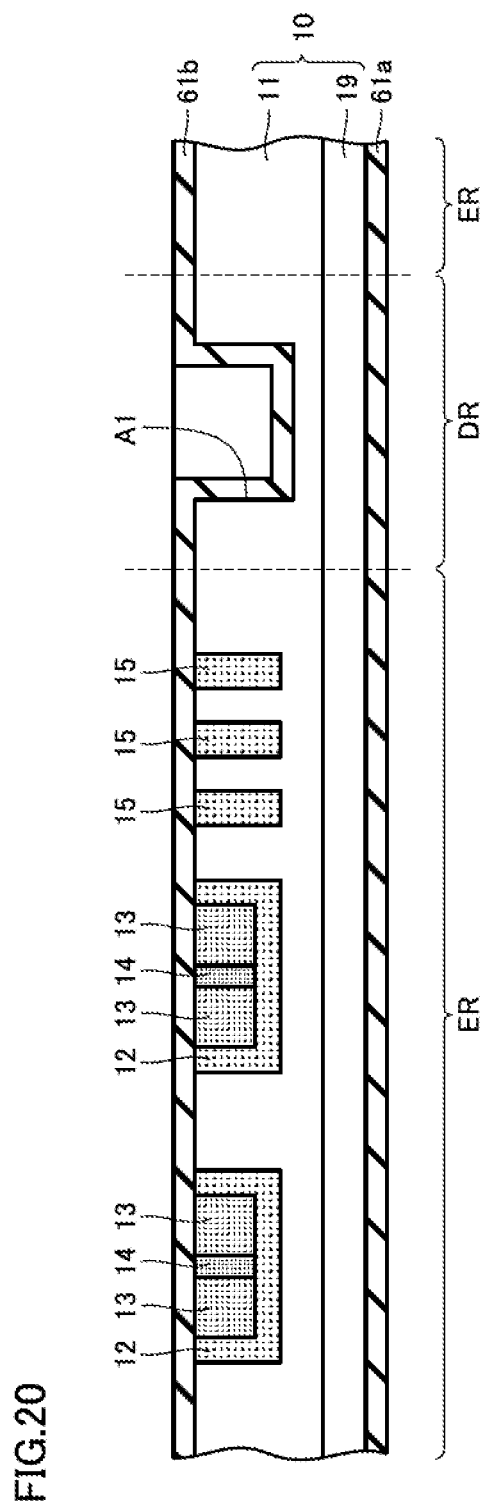
FIG. 20 is a partial sectional view schematically showing an eighteenth step of the method of manufacturing the silicon carbide semiconductor device according to the first embodiment of the present invention.
Figure 21:
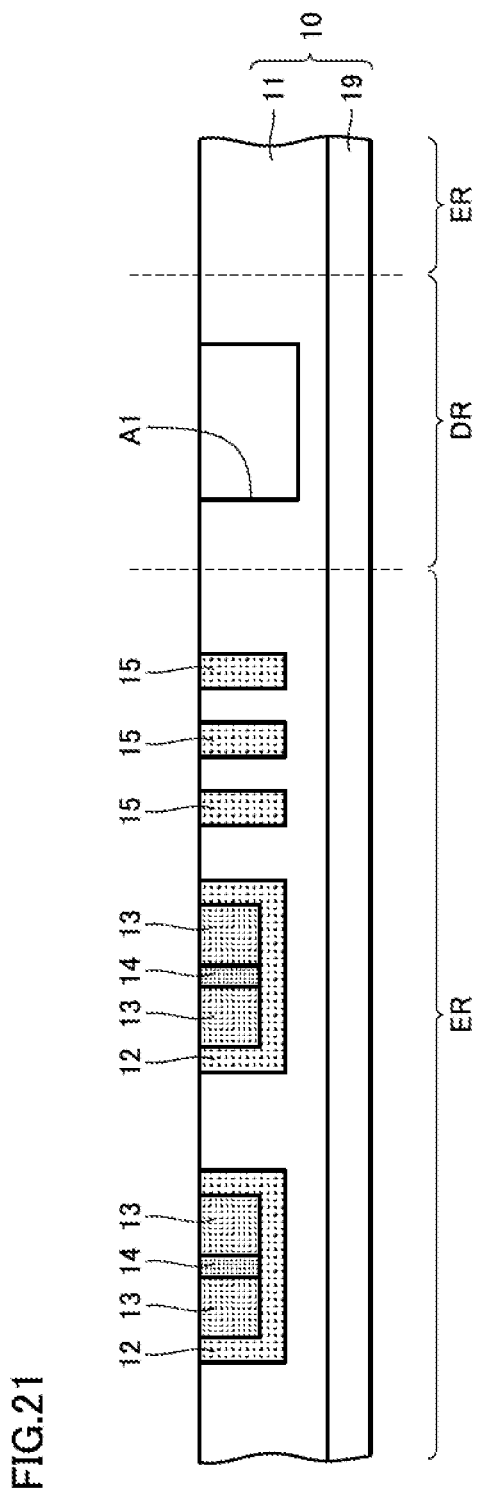
FIG. 21 is a partial sectional view schematically showing a nineteenth step of the method of manufacturing the silicon carbide semiconductor device according to the first embodiment of the present invention.

Referring to FIG. 20, contact regions 14 and guard rings 15 are formed by impurity implantation. These can be formed with a method substantially the same as that for forming body regions 12. Protecting films 61*a* and 61*b* are then removed (FIG. 21). These can be removed, for example, by wet etching with hydrofluoric acid.

Next, epitaxial substrate 10 is annealed in order to activate the impurities that have been implanted into epitaxial substrate 10. An annealing temperature is preferably 1500° C. or more, more preferably 1700° C. or more, and further preferably 1800° C. or more. The annealing temperature is preferably 2000° C. or less, more preferably 1900° C. or less, and further preferably 1850° C. or more.

Figure 22:
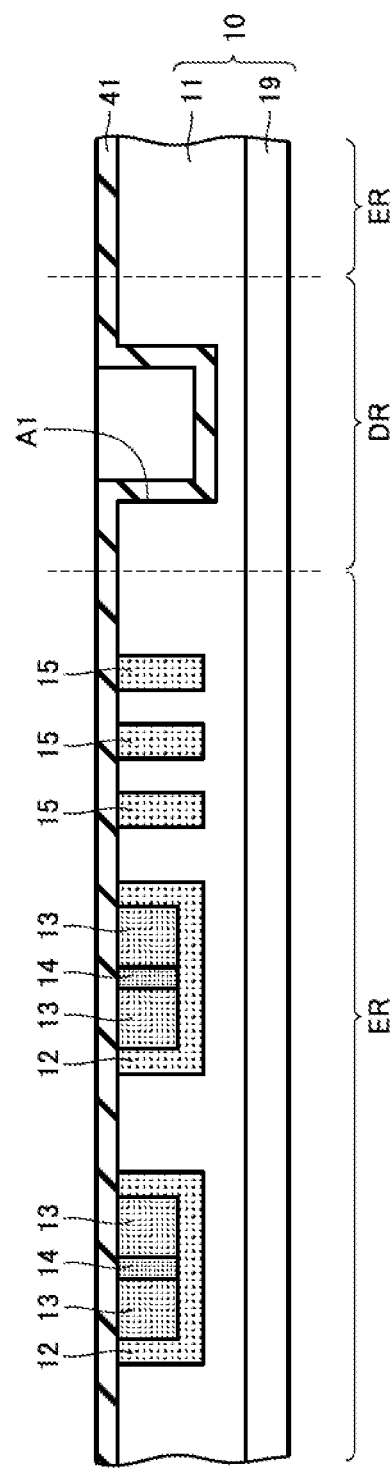
FIG. 22 is a partial sectional view schematically showing a twentieth step of the method of manufacturing the silicon carbide semiconductor device according to the first embodiment of the present invention.

Referring to FIG. 22, gate oxide film 41 is formed. Gate oxide film 41 can be formed by thermal oxidation of epitaxial substrate 10.

Figure 23:
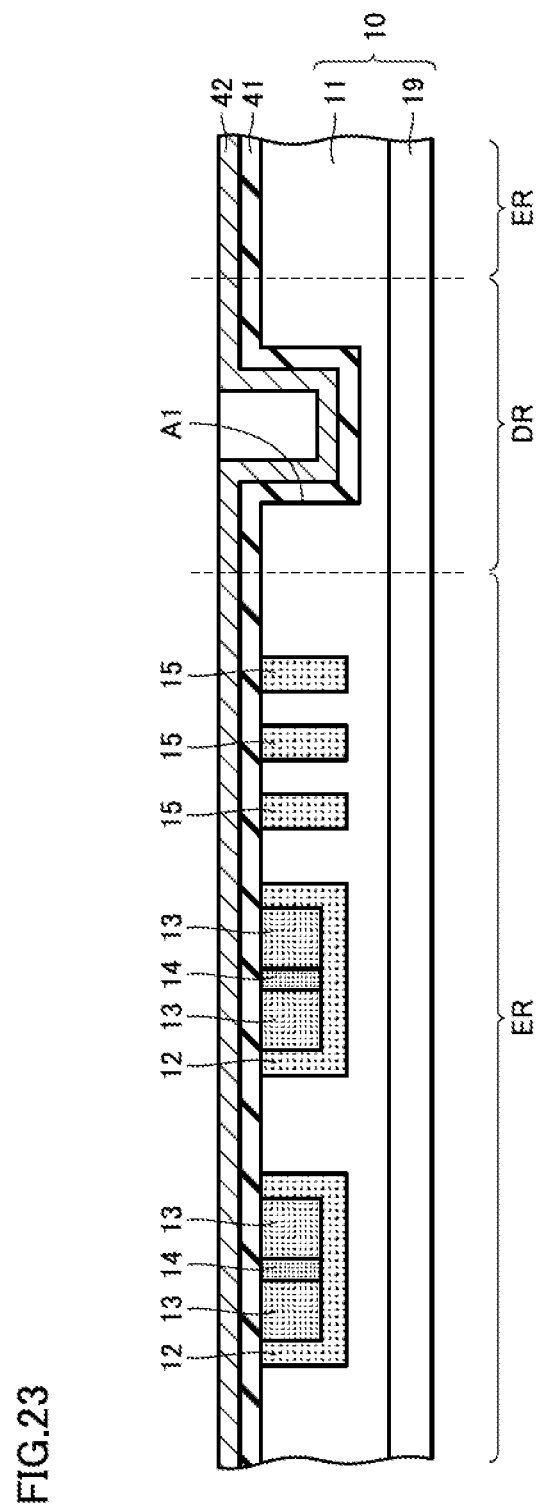
FIG. 23 is a partial sectional view schematically showing a twenty-first step of the method of manufacturing the silicon carbide semiconductor device according to the first embodiment of the present invention.

Referring to FIG. 23, gate electrode 42 is deposited. This deposition can be performed by CVD.

Referring to FIGS. 24 to 27, gate electrode 42 is patterned by means of photolithography using recess A1 in epitaxial substrate 10 as an alignment mark, as described below.

Figure 24:
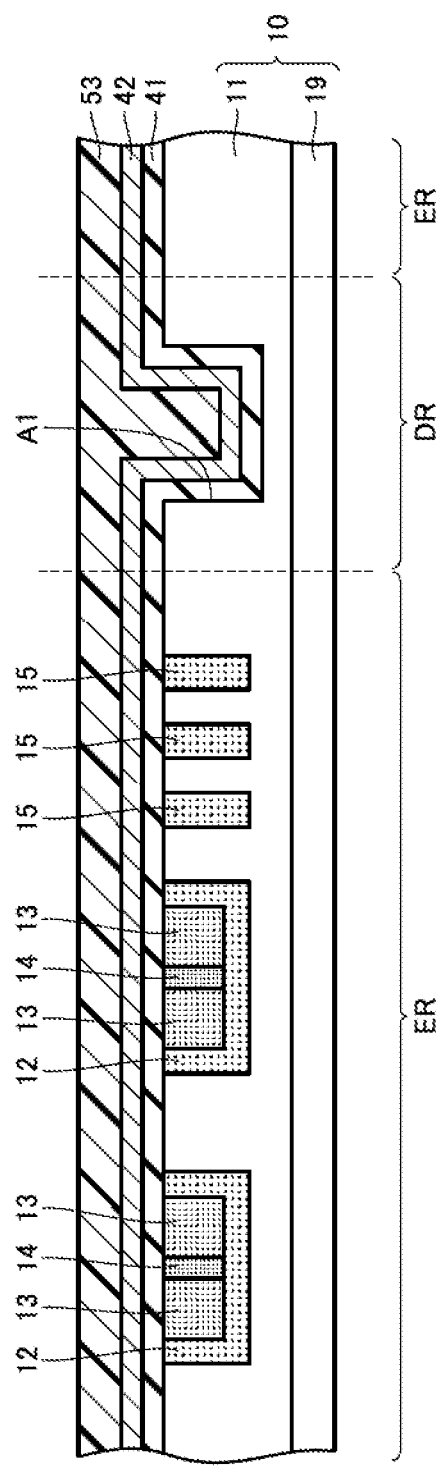
FIG. 24 is a partial sectional view schematically showing a twenty-second step of the method of manufacturing the silicon carbide semiconductor device according to the first embodiment of the present invention.
Figure 25:
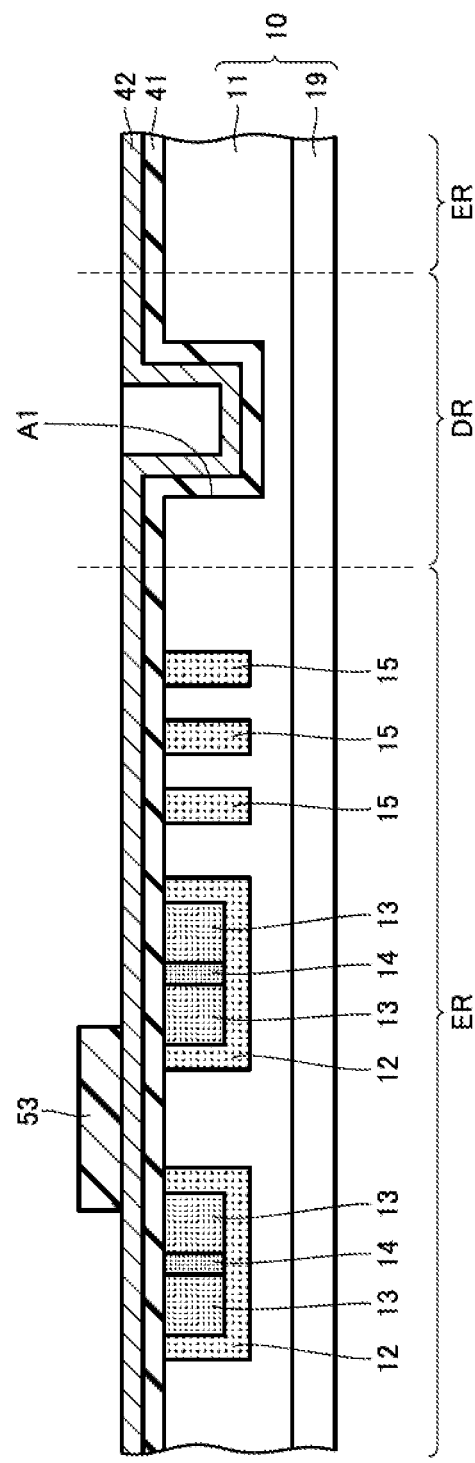
FIG. 25 is a partial sectional view schematically showing a twenty-third step of the method of manufacturing the silicon carbide semiconductor device according to the first embodiment of the present invention.
Figure 26:
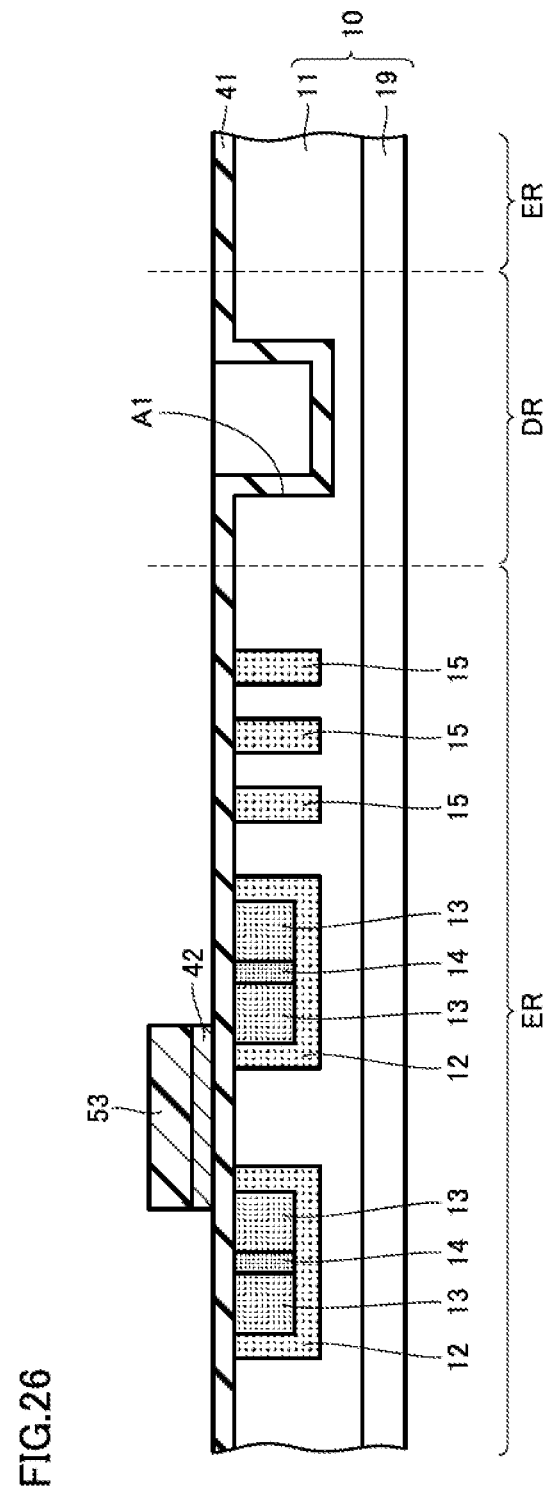
FIG. 26 is a partial sectional view schematically showing a twenty-fourth step of the method of manufacturing the silicon carbide semiconductor device according to the first embodiment of the present invention.
Figure 27:
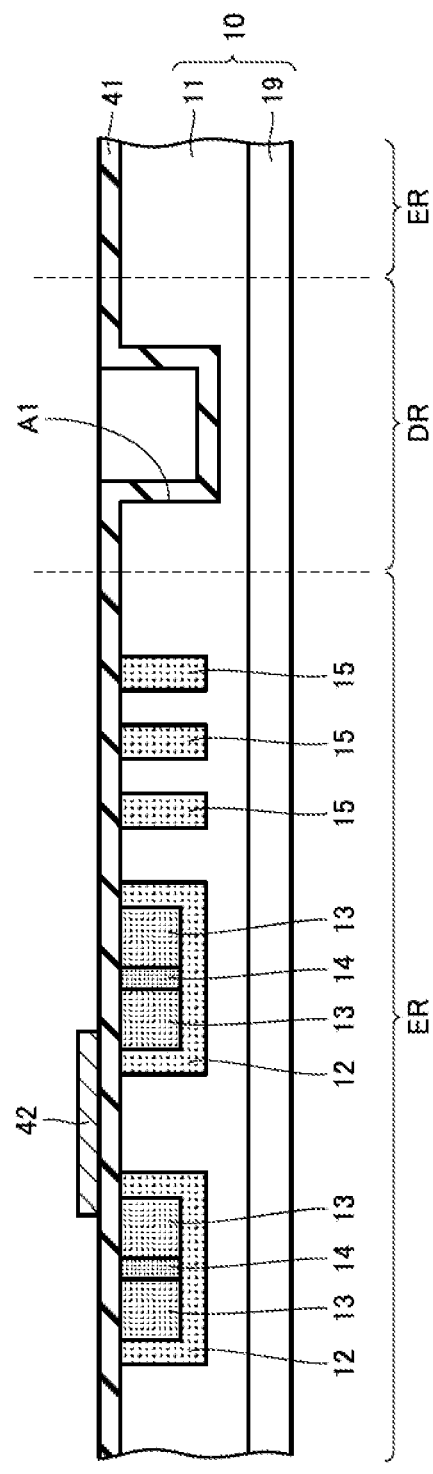
FIG. 27 is a partial sectional view schematically showing a twenty-fifth step of the method of manufacturing the silicon carbide semiconductor device according to the first embodiment of the present invention.
Figure 28:
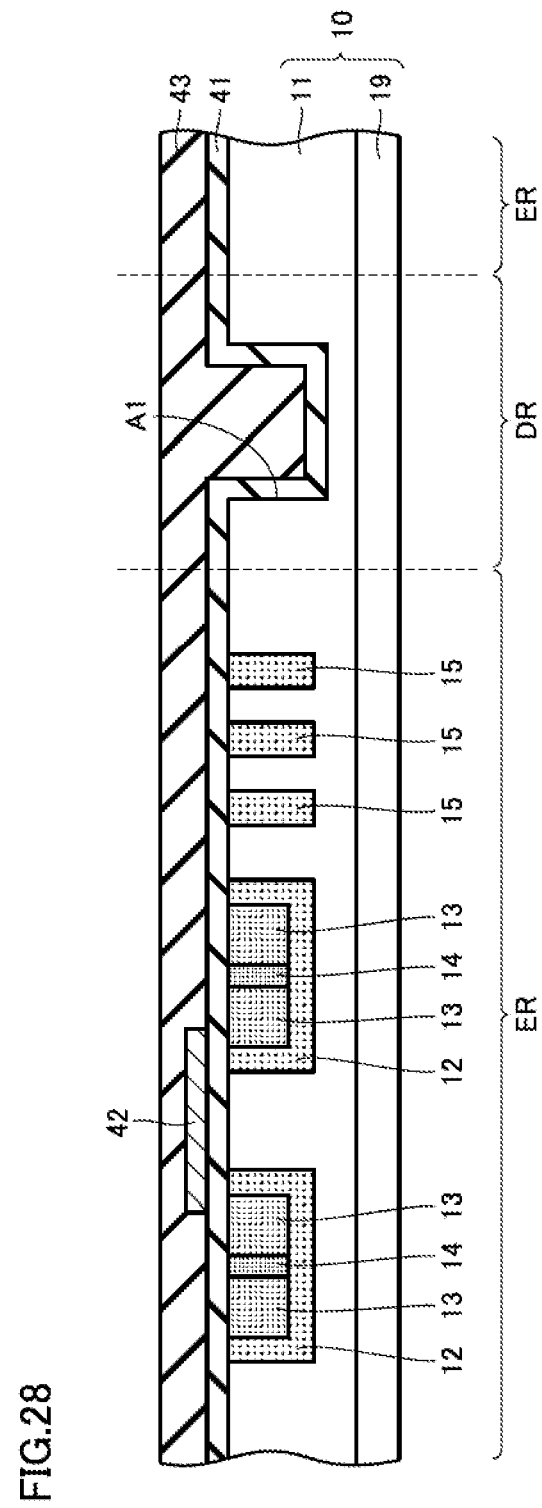
FIG. 28 is a partial sectional view schematically showing a twenty-sixth step of the method of manufacturing the silicon carbide semiconductor device according to the first embodiment of the present invention.
Figure 29:
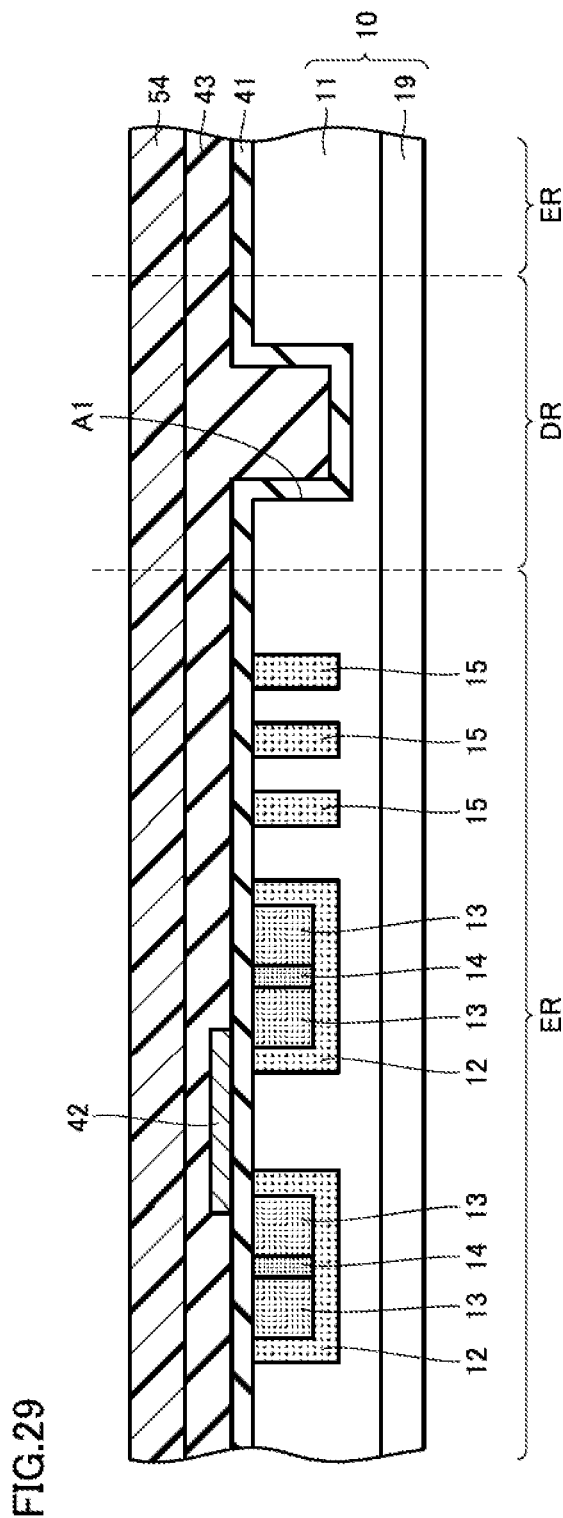
FIG. 29 is a partial sectional view schematically showing a twenty-seventh step of the method of manufacturing the silicon carbide semiconductor device according to the first embodiment of the present invention.

Specifically, a photoresist layer 53 (FIG. 24) is first formed on gate electrode 42. Photoresist layer 53 is formed by applying a photoresist solution by means of a coater. A pattern is formed in photoresist layer 53 (FIG. 25). The pattern is formed by exposure with an exposure device and development with a development device of photoresist layer 53. The exposure device optically recognizes the position of recess A1 as an alignment mark in order to perform alignment for the exposure. This recognition may be achieved by reflection of light from a surface of gate electrode 42 on recess A1. Then, gate electrode 42 is partially etched with photoresist layer 53 as a mask. The pattern of photoresist layer 53 is thus transferred to gate electrode 42 (FIG. 26). Photoresist layer 53 is then removed (FIG. 27).

Referring to FIGS. 28 to 33, source electrode 31 is formed on epitaxial substrate 10 by means of photolithography using recess A1 in epitaxial substrate 10 as an alignment mark. In this embodiment, source electrode 31 is formed by a lift-off process as described below.

Figure 30:
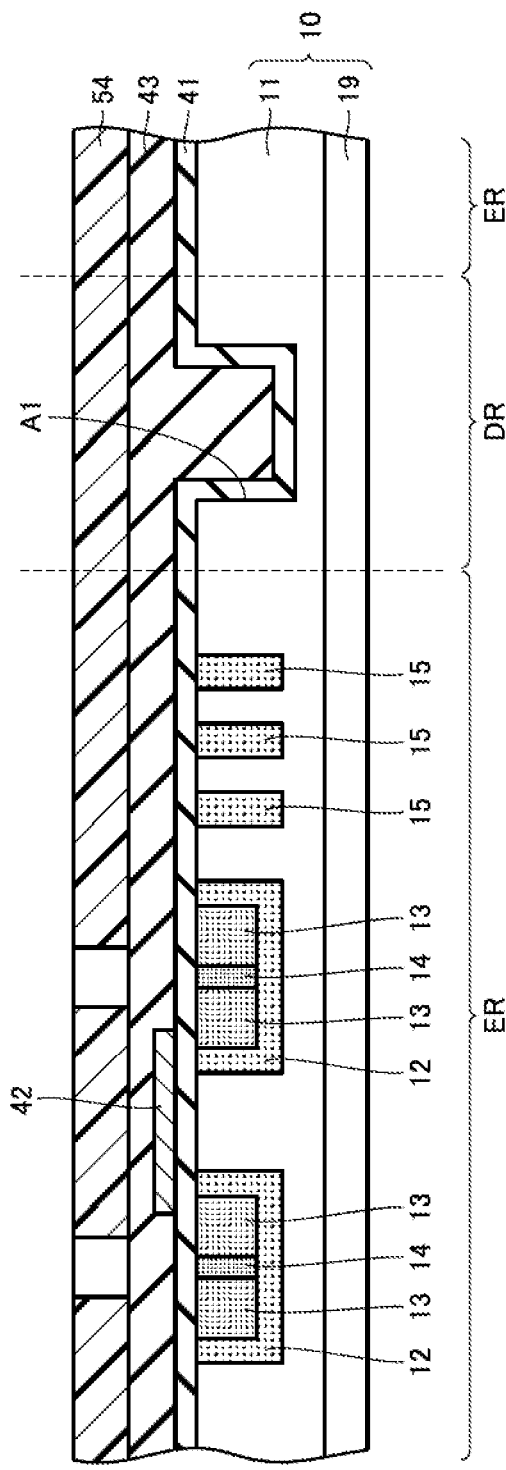
FIG. 30 is a partial sectional view schematically showing a twenty-eighth step of the method of manufacturing the silicon carbide semiconductor device according to the first embodiment of the present invention.
Figure 31:
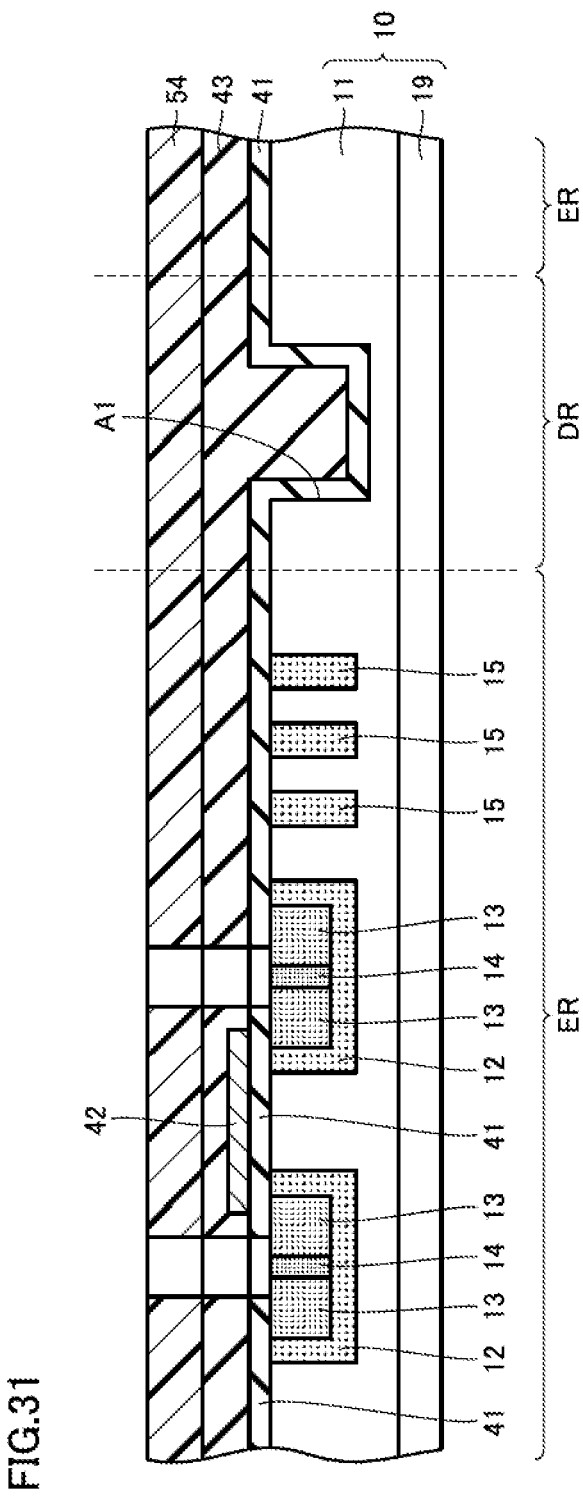
FIG. 31 is a partial sectional view schematically showing a twenty-ninth step of the method of manufacturing the silicon carbide semiconductor device according to the first embodiment of the present invention.
Figure 32:
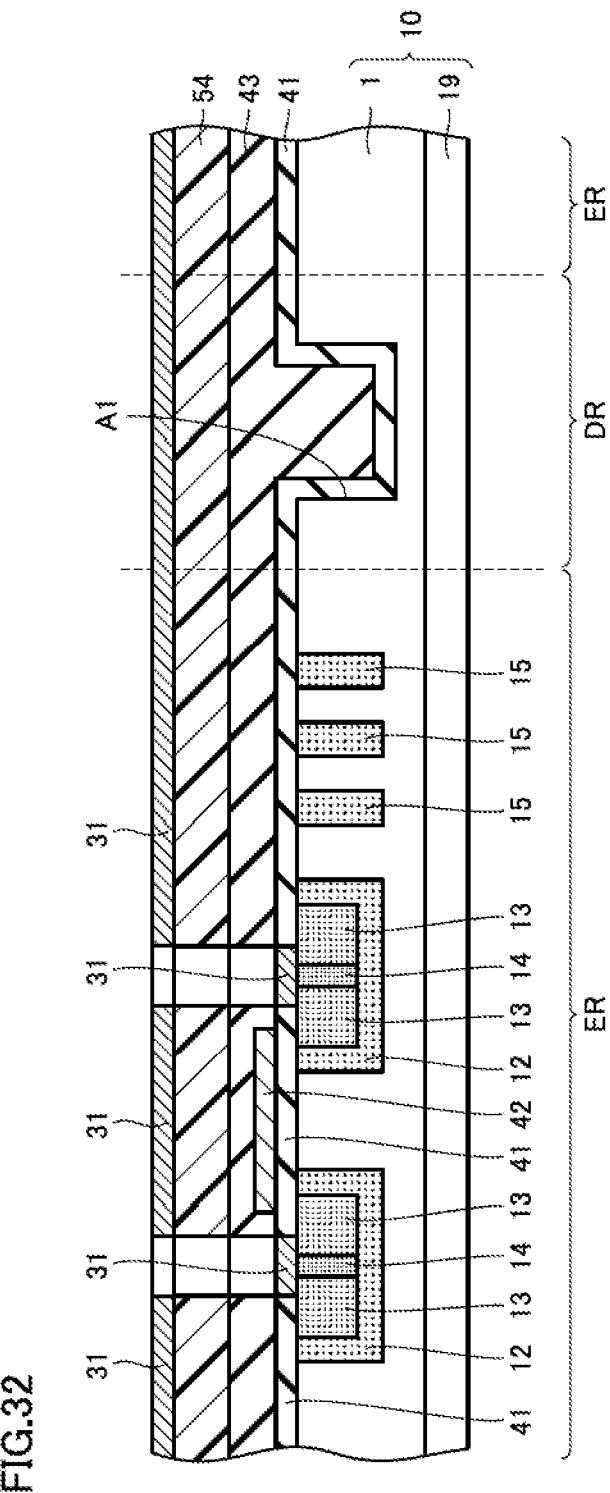
FIG. 32 is a partial sectional view schematically showing a thirtieth step of the method of manufacturing the silicon carbide semiconductor device according to the first embodiment of the present invention.
Figure 33:
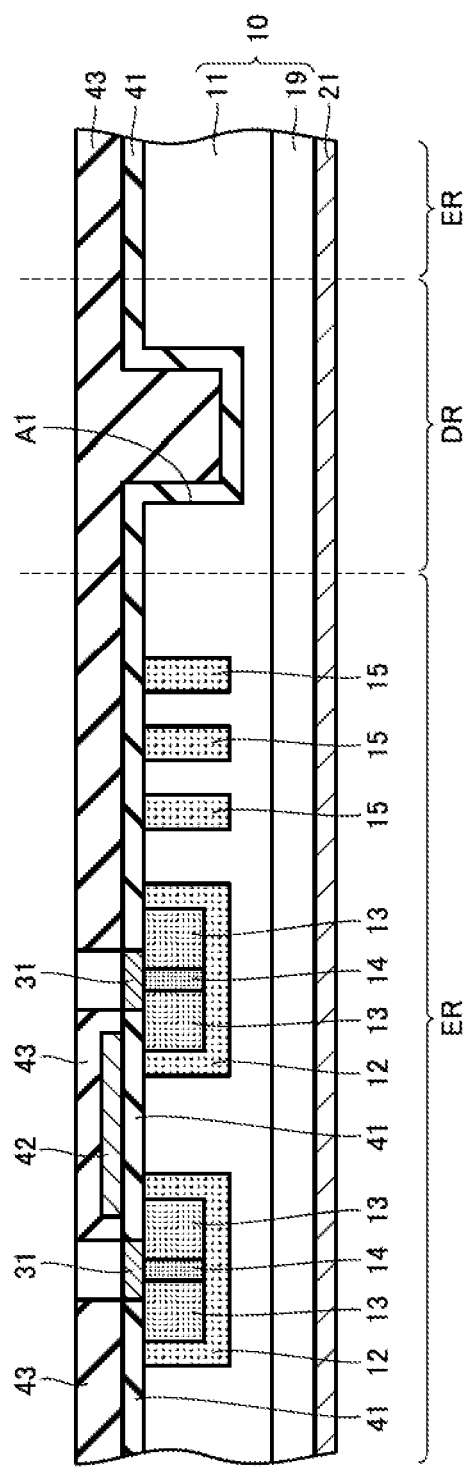
FIG. 33 is a partial sectional view schematically showing a thirty-first step of the method of manufacturing the silicon carbide semiconductor device according to the first embodiment of the present invention.

Specifically, interlayer insulating film 43 (FIG. 28) is first deposited to cover gate oxide film 41 and gate electrode 42. This deposition can be performed by CVD. A photoresist layer 54 (FIG. 29) is formed on interlayer insulating film 43. Photoresist layer 54 is formed by applying a photoresist solution by means of a coater. A pattern is formed in photoresist layer 54 (FIG. 30). The pattern is formed by exposure with an exposure device and development with a development device of photoresist layer 54. The exposure device optically recognizes the position of recess A1 as an alignment mark in order to perform alignment for the exposure. This recognition may be achieved by reflection of light from the surface of epitaxial substrate 10 on recess A1. Then, interlayer insulating film 43 is partially etched with photoresist layer 54 as a mask. The pattern of photoresist layer 54 is thus transferred to each of interlayer insulating film 43 and gate oxide film 41 (FIG. 31). Then, source electrode 31 is deposited on photoresist layer 54 and portions of epitaxial substrate 10 which are exposed at openings in photoresist layer 54 (FIG. 32). This deposition can be performed by sputtering. For example, a metal film including Ti, Al and Si is deposited. Photoresist layer 54 is then removed (FIG. 33). Source electrode 31 on epitaxial substrate 10 is thus formed.

Drain electrode 21 is deposited on a surface of epitaxial substrate 10 opposite to the surface on which source electrode 31 has been formed. The deposition of drain electrode 21 is performed in the same manner as the deposition of source electrode 31. Then, each of source electrode 31 and drain electrode 21 is subjected to heat treatment such that each of source electrode 31 and drain electrode 21 is in ohmic contact with epitaxial substrate 10. A temperature of this heat treatment is, for example, about 1000° C.

Figure 34:
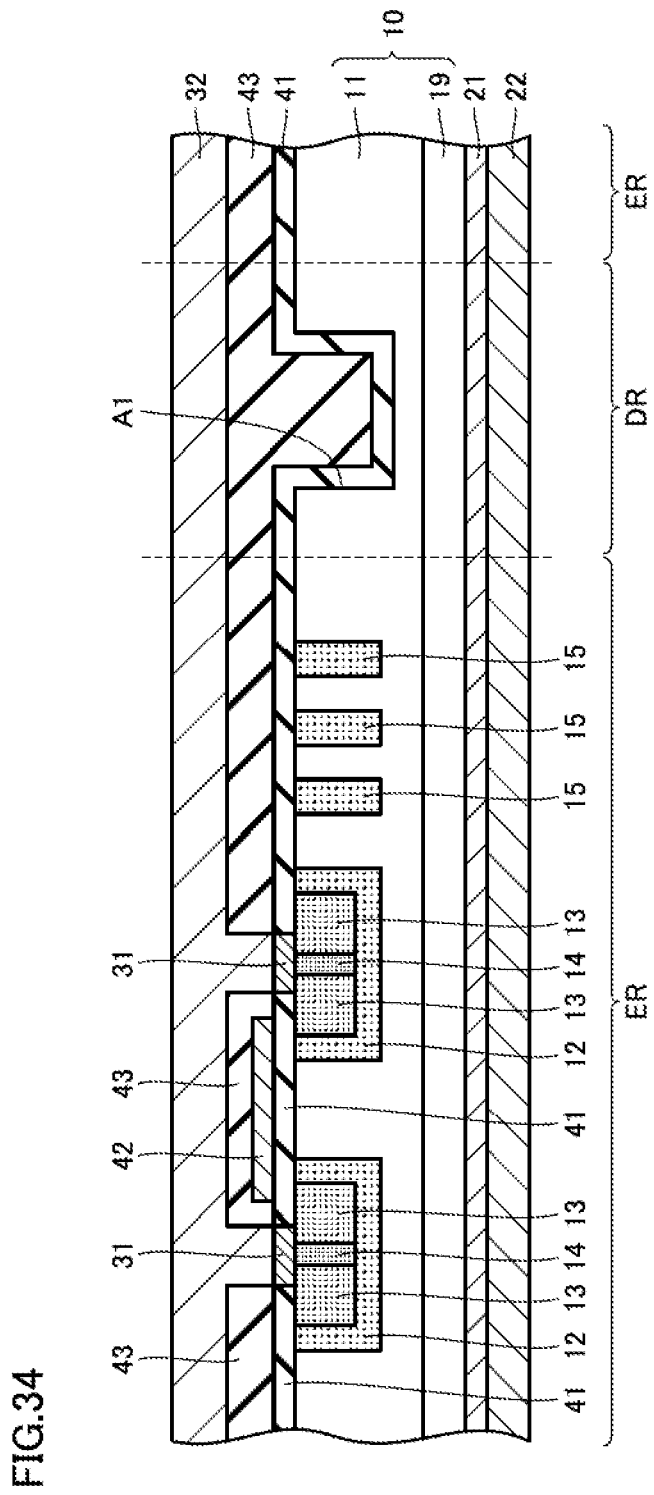
FIG. 34 is a partial sectional view schematically showing a thirty-second step of the method of manufacturing the silicon carbide semiconductor device according to the first embodiment of the present invention.

Referring to FIG. 34, source interconnect layer 32 is formed on source electrode 31 and interlayer insulating film 43. In addition, drain interconnect layer 22 is formed on drain electrode 21. The steps at a wafer level are thus completed. Then, dicing is performed in dicing region DR (FIGS. 34 and 2) to separate chip regions ER from one another. The dicing causes disappearance of dicing region DR, and thus may also cause disappearance of recess A1.

MOSFET 90 (FIG. 1) is obtained in this manner.

According to this embodiment, recess A1 is formed of epitaxial substrate 10. Recess A1 thus has sufficient heat resistance at the activation annealing temperature as well. Accordingly, recess A1 can be used as an alignment mark both before and after the activation annealing. Specifically, recess A1 can be used as an alignment mark during each of the exposure of photoresist layer 52 (FIG. 12) and the exposure of photoresist layer 53 (FIG. 25).

Further, after gate electrode 42 is patterned, source electrode 31 is formed on epitaxial substrate 10 by means of photolithography using recess A1 in epitaxial substrate 10 as an alignment mark. Thus, the pattern of source electrode 31 can be aligned with the pattern for impurity implantation with high accuracy.

Epitaxial substrate 10 may be annealed at 1500° C. or more and 2000° C. or less. The impurities are sufficiently activated owing to the annealing temperature of 1500° C. or more. The annealing can be more readily performed owing to the annealing temperature of 2000° C. or less.

Before mask layer 72 is formed, protecting film 61b made of a material different from each of the material for mask layer 72 and silicon carbide may be formed on recess A1. Protecting film 61b can prevent direct contamination of epitaxial substrate 10. Protecting film 61b may be removed after the impurity implantation. In this case, epitaxial substrate 10 is protected by protecting film 61b during the impurity implantation. Thus, the contamination of epitaxial substrate 10 during the impurity implantation can be prevented. Protecting film 61b may be removed before the annealing of epitaxial substrate 10. Thus, contaminants are removed along with protecting film 61b before the annealing. Accordingly, the diffusion of the contaminants into epitaxial substrate 10 during the annealing can be prevented.

The material for protecting film 61b may have a melting point of 1500° C. or less. Thus, protecting film 61b having difficulty in withstanding the temperature of the impurity activation annealing is removed before the annealing. Accordingly, the low heat resistance of protecting film 61b does not present any problems. The material for protecting film 61b may contain at least one of silicon oxide, silicon nitride and silicon oxynitride. Thus, protecting film 61b having difficulty in withstanding the temperature of the impurity activation annealing is removed before the annealing. Accordingly, the low heat resistance of protecting film 61b does not present any problems.

Second Embodiment

Figure 35:
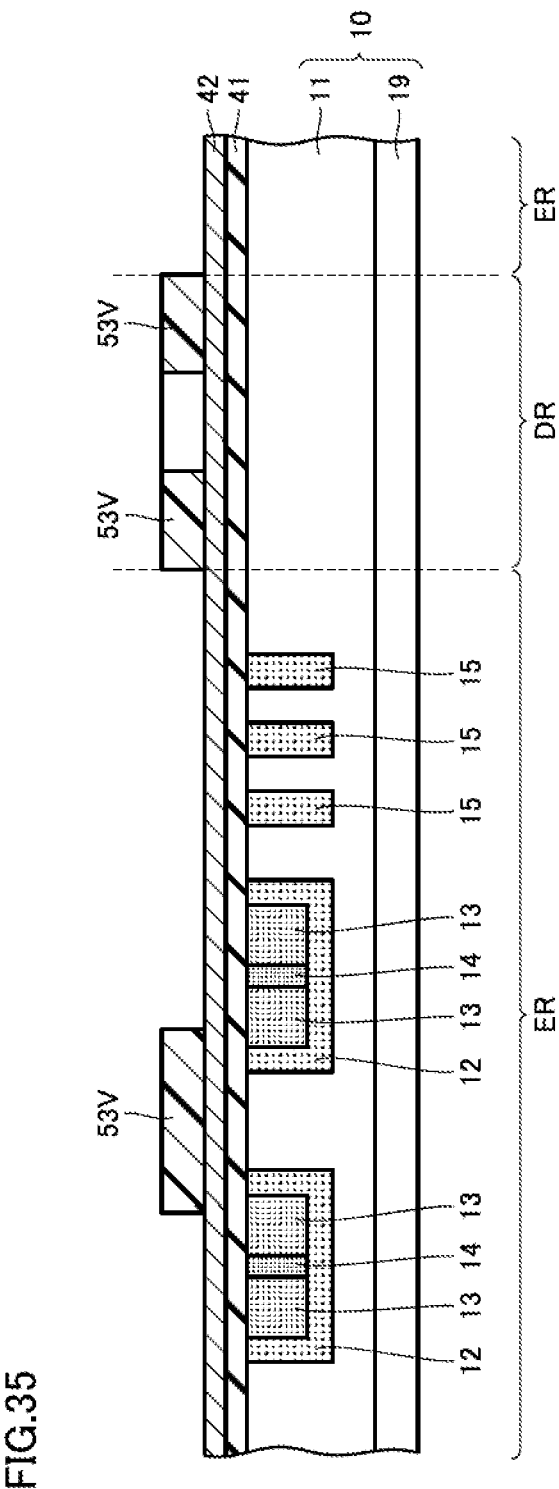
FIG. 35 is a partial sectional view schematically showing a twenty-third step of a method of manufacturing a silicon carbide semiconductor device according to a second embodiment of the present invention.

In this embodiment, another manufacturing method for obtaining MOSFET 90 (FIG. 1) is described. First, the steps shown in FIGS. 3 to 24 are performed in a manner substantially the same as in the first embodiment. Photoresist layer 53 is thus formed. The sectional view of FIG. 24 is a diagram along a cross-sectional position where recess A1 appears. Recess A1 will disappear if the cross-sectional position of the sectional view is moved. FIG. 35 and the subsequent figures are sectional views along such a cross-sectional position.

Referring to FIG. 35, a photoresist layer 53V having a pattern is formed by patterning photoresist layer 53. The pattern is formed by exposure with an exposure device and development with a development device of photoresist layer 53. The exposure device optically recognizes the position of recess A1 (FIG. 24) as an alignment mark in order to perform alignment for the exposure. This recognition may be achieved by reflection of light from the surface of gate electrode 42 on recess A1.

Figure 36:
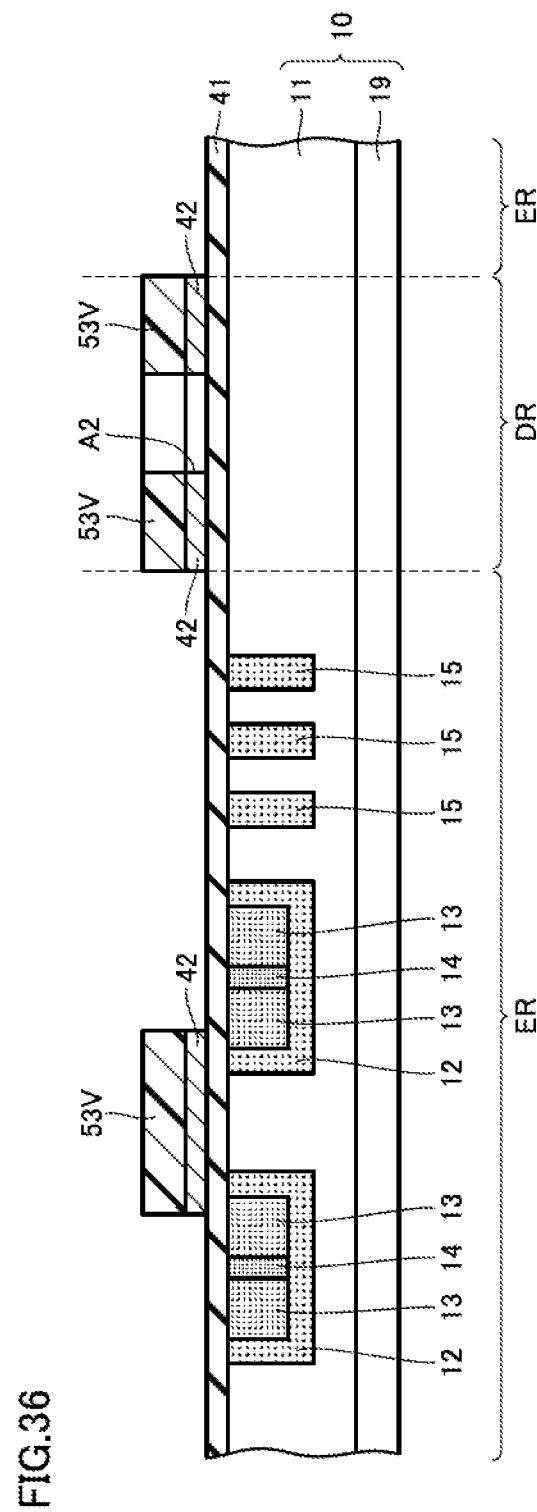
FIG. 36 is a partial sectional view schematically showing a twenty-fourth step of the method of manufacturing the silicon carbide semiconductor device according to the second embodiment of the present invention.
Figure 37:
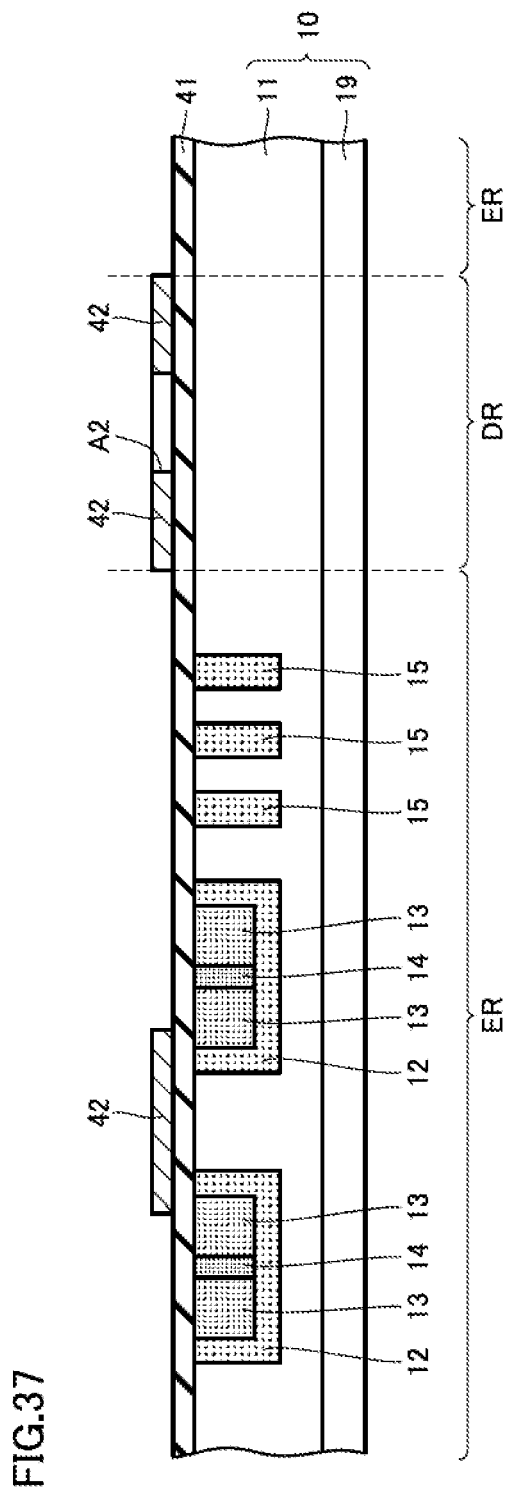
FIG. 37 is a partial sectional view schematically showing a twenty-fifth step of the method of manufacturing the silicon carbide semiconductor device according to the second embodiment of the present invention.

Referring to FIG. 36, gate electrode 42 is partially etched with photoresist layer 53V as a mask. The pattern of photoresist layer 53V is thus transferred to gate electrode 42. That is, gate electrode 42 is patterned. In so doing, a mark portion A2 is formed by partial removal of gate electrode 42. In this embodiment, mark portion A2 is a pattern provided in gate electrode 42 in dicing region DR, and this pattern may be an opening pattern. Photoresist layer 53V is then removed (FIG. 37).

Then, source electrode 31 is formed on epitaxial substrate 10 by means of photolithography using mark portion A2 of gate electrode 42 as an alignment mark. In this embodiment, source electrode 31 is formed by a lift-off process as described below.

Figure 38:
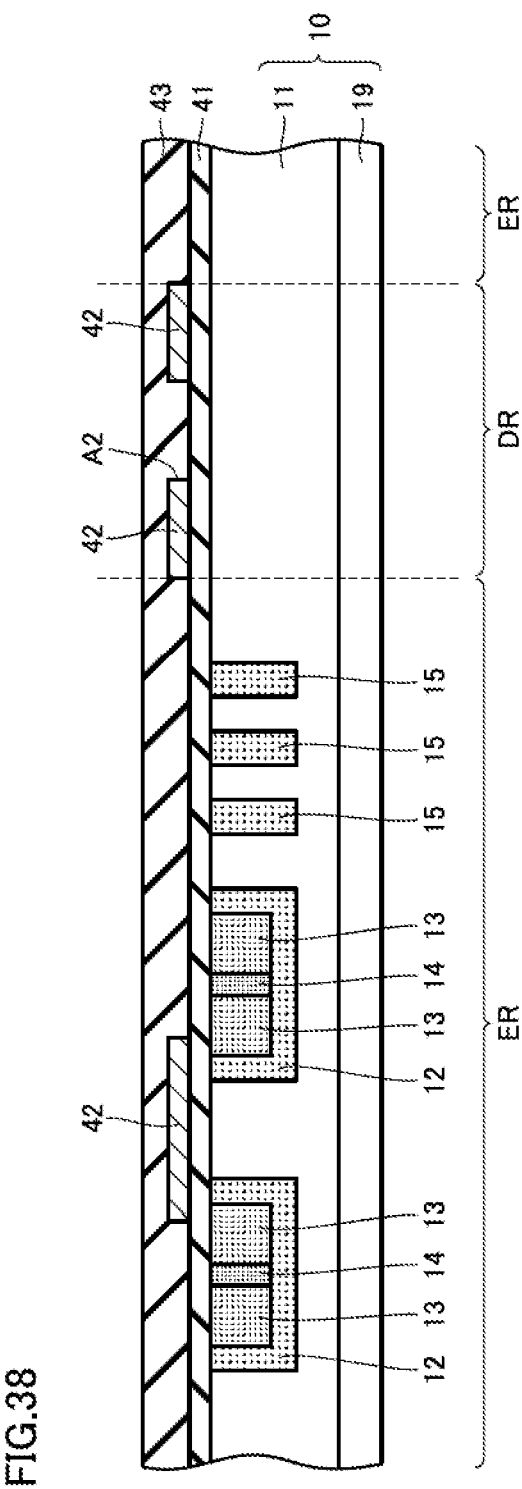
FIG. 38 is a partial sectional view schematically showing a twenty-sixth step of the method of manufacturing the silicon carbide semiconductor device according to the second embodiment of the present invention.
Figure 39:
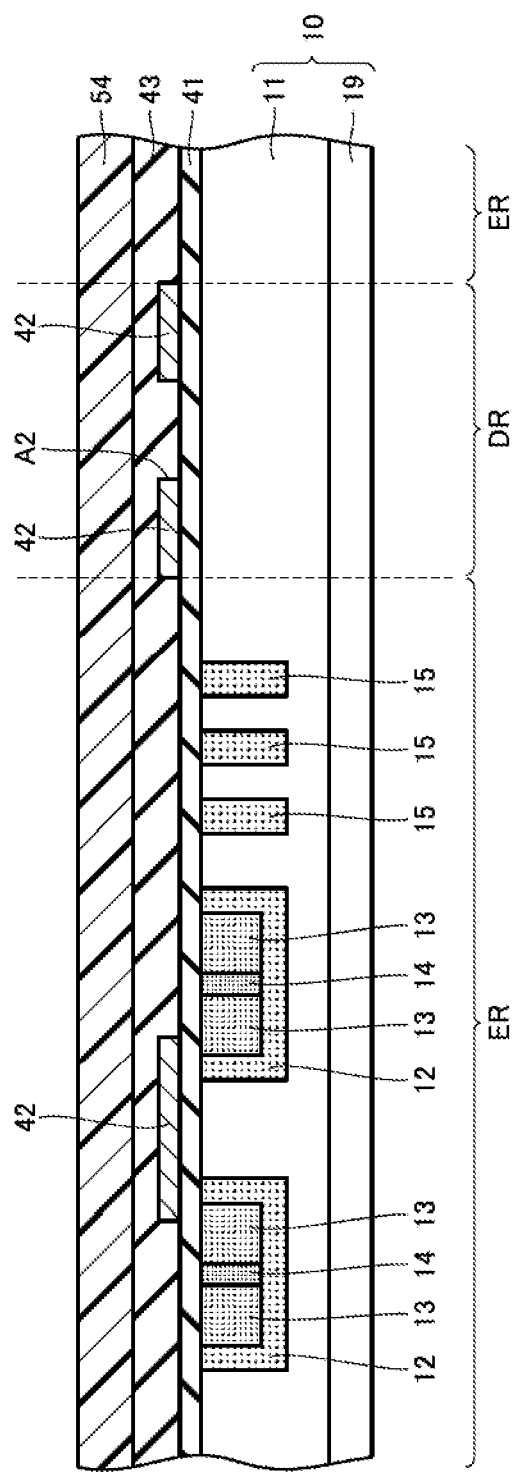
FIG. 39 is a partial sectional view schematically showing a twenty-seventh step of the method of manufacturing the silicon carbide semiconductor device according to the second embodiment of the present invention.
Figure 40:
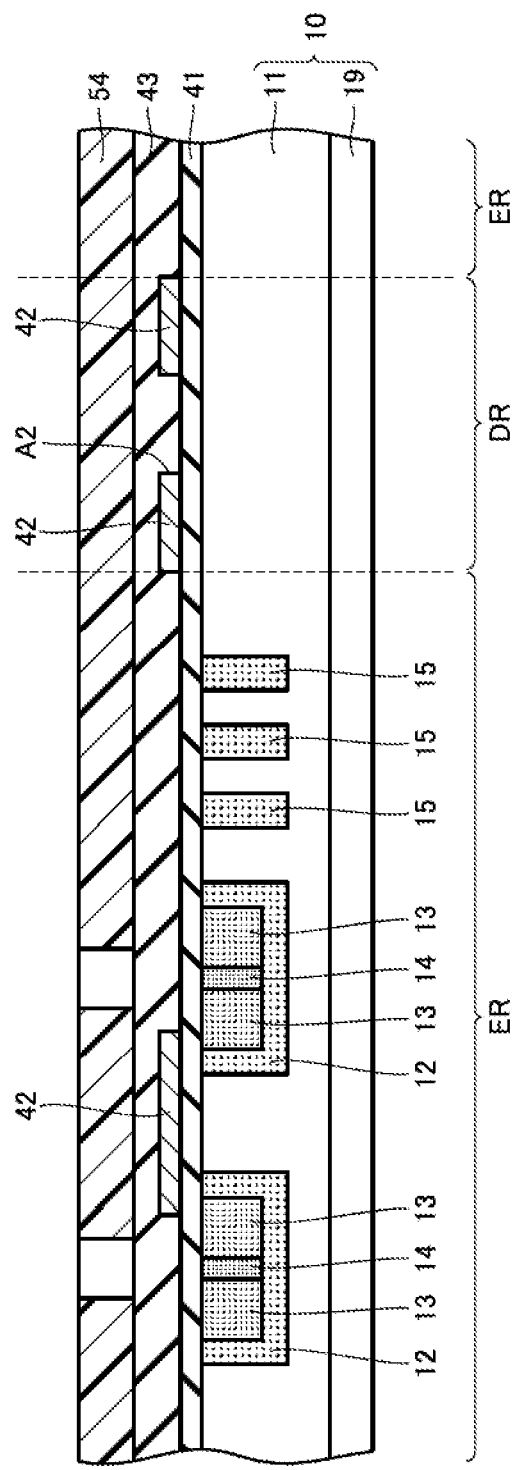
FIG. 40 is a partial sectional view schematically showing a twenty-eighth step of the method of manufacturing the silicon carbide semiconductor device according to the second embodiment of the present invention.

Specifically, interlayer insulating film 43 (FIG. 38) is first deposited to cover gate oxide film 41 and gate electrode 42. This deposition can be performed by CVD. Photoresist layer 54 (FIG. 39) is formed on interlayer insulating film 43. Photoresist layer 54 is formed by applying a photoresist solution by means of a coater. A pattern is formed in photoresist layer 54 (FIG. 40). The pattern is formed by exposure with an exposure device and development with a development device of photoresist layer 54. The exposure device optically recognizes the position of mark portion A2 as an alignment mark in order to perform alignment for the exposure.

After that, steps substantially the same as the steps shown in FIGS. 31 to 34 in the first embodiment are performed, whereby MOSFET 90 (FIG. 1) is obtained.

According to this embodiment, the pattern of source electrode 31 can be aligned with the pattern of gate electrode 42 with high accuracy.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims. For example, the MOSFET is not limited to have a planar gate structure but may have a trench gate structure. The silicon carbide semiconductor device may be a MISFET (Metal Insulator Semiconductor Field Effect Transistor) other than the MOSFET. The silicon carbide semiconductor device is not limited to the MISFET, but may be, for example, a Schottky barrier diode or an IGBT (Insulated Gate Bipolar Transistor). The first conductivity type may be p type conductivity and the second conductivity type may be n type conductivity. The impurities may be implanted in any order.

REFERENCE SIGNS LIST 10 epitaxial substrate (silicon carbide substrate); 11 drift layer; 12 body region; 13 source region; 14 contact region;

15 guard ring; 19 single-crystal substrate; 21 drain electrode; 22 drain interconnect layer; 31 source electrode (second electrode layer); 32 source interconnect layer; 41 gate oxide film (gate insulating film); 42 gate electrode (first electrode layer); 43 interlayer insulating film; 51, 52, 53, 53V, 54 photoresist layer; 61a, 61b protecting film; 62 etching stop film; 72 mask layer; 73 sidewall film; 90 MOSFET (silicon carbide semiconductor device); A1 recess; A2 mark portion; DR dicing region; ER chip region.

The invention claimed is:

1. A method of manufacturing a silicon carbide semiconductor device, comprising the steps of:
    forming a recess in a silicon carbide substrate by partially etching said silicon carbide substrate;
    forming a mask layer having a pattern on said silicon carbide substrate by means of photolithography using said recess in said silicon carbide substrate as an alignment mark;
    implanting an impurity into said silicon carbide substrate using said mask layer;
    annealing said silicon carbide substrate in order to activate said impurity;
    after said step of annealing said silicon carbide substrate, depositing a first electrode layer on said silicon carbide substrate; and
    patterning said first electrode layer by means of photolithography using said recess in said silicon carbide substrate as an alignment mark.

2. The method of manufacturing a silicon carbide semiconductor device according to claim 1, wherein
    said step of annealing said silicon carbide substrate is performed at 1500° C. or more and 2000° C. or less.

3. The method of manufacturing a silicon carbide semiconductor device according to claim 1, further comprising the step of, before said step of forming a mask layer, forming a protecting film made of a material different from each of a material for said mask layer and silicon carbide on said recess.

4. The method of manufacturing a silicon carbide semiconductor device according to claim 3, further comprising the step of, after said step of implanting an impurity, removing said protecting film.

5. The method of manufacturing a silicon carbide semiconductor device according to claim 4, wherein
    said step of removing said protecting film is performed before said step of annealing said silicon carbide substrate.

6. The method of manufacturing a silicon carbide semiconductor device according to claim 5, wherein
    said material for said protecting film has a melting point of 1500° C. or less.

7. The method of manufacturing a silicon carbide semiconductor device according to claim 5, wherein
    said material for said protecting film contains at least one of silicon oxide, silicon nitride and silicon oxynitride.

8. The method of manufacturing a silicon carbide semiconductor device according to claim 1, further comprising the step of, after said step of patterning said first electrode layer, forming a second electrode layer on said silicon carbide substrate by means of photolithography using said recess in said silicon carbide substrate as an alignment mark.

9. The method of manufacturing a silicon carbide semiconductor device according to claim 1, wherein
    said step of patterning said first electrode layer includes the step of forming a mark portion by partially removing said first electrode layer, and
    said method further comprises the step of forming a second electrode layer on said silicon carbide substrate by means of photolithography using said mark portion of said first electrode layer as an alignment mark.

* * * * *